United States Patent
Nandwana et al.

(10) Patent No.: US 11,830,731 B2
(45) Date of Patent: Nov. 28, 2023

(54) SEMICONDUCTOR DEPOSITION REACTOR MANIFOLDS

(71) Applicant: ASM IP HOLDING B.V., Almere (NL)

(72) Inventors: Dinkar Nandwana, Tempe, AZ (US); Eric James Shero, Phoenix, AZ (US); Carl Louis White, Gilbert, AZ (US); Todd Robert Dunn, Cave Creek, AZ (US); William George Petro, Scottsdale, AZ (US); Jereld Lee Winkler, Gilbert, AZ (US); Aniket Chitale, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 200 days.

(21) Appl. No.: 17/074,887

(22) Filed: Oct. 20, 2020

(65) Prior Publication Data
US 2021/0118668 A1    Apr. 22, 2021

Related U.S. Application Data

(60) Provisional application No. 62/925,035, filed on Oct. 23, 2019, provisional application No. 62/924,608, filed on Oct. 22, 2019.

(51) Int. Cl.
*C23C 16/455* (2006.01)
*H01L 21/02* (2006.01)

(52) U.S. Cl.
CPC .... *H01L 21/0228* (2013.01); *C23C 16/45544* (2013.01); *H01L 21/0217* (2013.01);
(Continued)

(58) Field of Classification Search
CPC ........ C23C 16/45561; C23C 16/45544; C23C 16/45548
See application file for complete search history.

(56) References Cited

U.S. PATENT DOCUMENTS

| | | |
|---|---|---|
| 1,523,156 A | 1/1925 | Adams |
| 1,853,045 A | 4/1932 | Gnau |

(Continued)

FOREIGN PATENT DOCUMENTS

| | | |
|---|---|---|
| CN | 101117308 | 2/2008 |
| CN | 104561937 | 4/2015 |
| DE | 3715644 | 12/1988 |
| JP | H09-186111 | 7/1997 |
| JP | 2008-264640 | 11/2008 |
| JP | 4667541 | 4/2011 |
| JP | 2011-104482 | 6/2011 |

(Continued)

OTHER PUBLICATIONS

Baxter et al., "Chemical vapour deposition of electrochromic tungsten oxide films employing volatile tungsten(vl) 0X0 alkoxide/ β-diketonate complexes", Chem. Commun., 1996, pp. 1129-1130.

(Continued)

*Primary Examiner* — Joseph A Miller, Jr.
(74) *Attorney, Agent, or Firm* — Snell & Wilmer L.L.P.

(57) ABSTRACT

The present disclosure pertains to embodiments of a semiconductor deposition reactor manifold and methods of using the semiconductor deposition reactor manifold which can be used to deposit semiconductor layers using processes such as atomic layer deposition (ALD). The semiconductor deposition reactor manifold has a bore, a first supply channel, and a second supply channel. Advantageously, the first supply channel and the second supply channel merge with the bore in an offset fashion which leads to reduced cross-contamination within the supply channels.

18 Claims, 16 Drawing Sheets

(52) U.S. Cl.
CPC .. *H01L 21/02164* (2013.01); *H01L 21/02181* (2013.01); *H01L 21/02186* (2013.01); *H01L 21/02189* (2013.01)

(56) References Cited

U.S. PATENT DOCUMENTS

| | | | |
|---|---|---|---|
| 3,429,903 A | 2/1969 | Larson | |
| 3,784,631 A | 1/1974 | Menapace et al. | |
| 3,882,934 A | 5/1975 | Knoos et al. | |
| 3,913,617 A | 10/1975 | van Laar et al. | |
| 4,222,671 A | 9/1980 | Gilmore | |
| 4,401,052 A | 8/1983 | Baron et al. | |
| 4,410,281 A | 10/1983 | Crookes | |
| 4,422,773 A | 12/1983 | Cassaday et al. | |
| 4,649,859 A | 3/1987 | Wanlass | |
| 4,747,367 A | 5/1988 | Posa | |
| 4,828,224 A | 5/1989 | Crabb et al. | |
| 4,869,284 A | 9/1989 | Scott et al. | |
| 4,889,609 A | 12/1989 | Cannella | |
| 4,895,107 A | 1/1990 | Yano et al. | |
| 4,907,534 A | 3/1990 | Huang et al. | |
| 4,949,783 A | 8/1990 | Lakios et al. | |
| 4,951,601 A | 8/1990 | Maydan et al. | |
| 4,990,047 A | 2/1991 | Wagner et al. | |
| 5,004,374 A | 4/1991 | Grey | |
| 5,028,724 A | 7/1991 | Ivankovits et al. | |
| 5,071,460 A | 12/1991 | Fujiura et al. | |
| 5,080,549 A | 1/1992 | Goodwin et al. | |
| 5,106,453 A | 4/1992 | Benko et al. | |
| 5,121,705 A | 6/1992 | Sugino | |
| 5,131,627 A | 7/1992 | Kolenc | |
| 5,166,092 A | 11/1992 | Mochizuki et al. | |
| 5,186,718 A | 2/1993 | Tepman et al. | |
| 5,192,371 A | 3/1993 | Shuto et al. | |
| 5,199,483 A | 4/1993 | Bahng | |
| 5,217,501 A | 6/1993 | Fuse et al. | |
| 5,223,001 A | 6/1993 | Saeki | |
| 5,229,615 A | 7/1993 | Brune et al. | |
| 5,248,253 A | 9/1993 | Philipossian et al. | |
| 5,252,131 A | 10/1993 | Kiyama et al. | |
| 5,284,519 A | 2/1994 | Gadgil | |
| 5,286,296 A | 2/1994 | Sato et al. | |
| 5,288,327 A | 2/1994 | Bhat | |
| 5,350,453 A | 9/1994 | Scholosser | |
| 5,388,944 A | 2/1995 | Takanabe et al. | |
| 5,391,035 A | 2/1995 | Krueger | |
| 5,405,446 A | 4/1995 | Nakajima et al. | |
| 5,433,785 A | 7/1995 | Saito | |
| 5,462,397 A | 10/1995 | Iwabuchi | |
| 5,488,925 A | 2/1996 | Kumada | |
| 5,516,732 A | 5/1996 | Flegal | |
| 5,520,742 A | 5/1996 | Ohkase | |
| 5,520,743 A | 5/1996 | Takahashi | |
| 5,525,157 A | 6/1996 | Hawkins et al. | |
| 5,538,390 A | 7/1996 | Salzman | |
| 5,571,330 A | 11/1996 | Kyogoku | |
| 5,586,585 A | 12/1996 | Bonora et al. | |
| 5,601,651 A | 2/1997 | Watabe | |
| 5,609,459 A | 3/1997 | Muka | |
| 5,728,223 A | 3/1998 | Murakami et al. | |
| 5,755,878 A | 5/1998 | Habuka et al. | |
| 5,789,027 A | 8/1998 | Watkins et al. | |
| 5,846,330 A | 12/1998 | Quirk et al. | |
| 5,851,294 A | 12/1998 | Young et al. | |
| 5,885,358 A | 3/1999 | Maydan et al. | |
| 5,893,641 A | 4/1999 | Garcia | |
| 5,938,840 A | 8/1999 | Habuka et al. | |
| 5,951,771 A | 9/1999 | Raney et al. | |
| 6,036,783 A | 3/2000 | Fukunaga et al. | |
| 6,070,550 A | 6/2000 | Ravi et al. | |
| 6,079,353 A | 6/2000 | Leksell et al. | |
| 6,110,529 A | 8/2000 | Gardiner et al. | |
| 6,114,227 A | 9/2000 | Leksell et al. | |
| 6,126,996 A | 10/2000 | Kirlin et al. | |
| 6,217,658 B1 | 4/2001 | Orczyk et al. | |
| 6,224,676 B1 | 5/2001 | Nakajima et al. | |
| 6,258,157 B1 | 7/2001 | Gordon | |
| 6,299,692 B1 | 10/2001 | Ku et al. | |
| 6,302,965 B1 | 10/2001 | Umotoy et al. | |
| 6,303,501 B1 | 10/2001 | Chen et al. | |
| 6,331,072 B1 | 12/2001 | Schierholz et al. | |
| 6,375,750 B1 | 4/2002 | van Os et al. | |
| 6,416,213 B1 | 7/2002 | Fukunaga | |
| 6,482,740 B2 | 11/2002 | Soininen et al. | |
| 6,534,133 B1 | 3/2003 | Kaloyeros et al. | |
| 6,539,891 B1 | 4/2003 | Lee et al. | |
| 6,660,177 B2 | 12/2003 | Carr | |
| 6,783,590 B2 | 8/2004 | Lindfors et al. | |
| 6,846,516 B2 | 1/2005 | Yang et al. | |
| 6,878,628 B2 | 4/2005 | Sophie et al. | |
| 6,881,263 B2 | 4/2005 | Lindfors et al. | |
| 6,884,296 B2 | 4/2005 | Basceri et al. | |
| 6,899,507 B2 | 5/2005 | Yamagishi et al. | |
| 6,905,547 B1 | 6/2005 | Londergan et al. | |
| 6,916,398 B2 | 7/2005 | Chen et al. | |
| 6,921,712 B2 | 7/2005 | Soininen et al. | |
| 7,018,478 B2 | 3/2006 | Lindfors et al. | |
| 7,021,881 B2 | 4/2006 | Yamagishi et al. | |
| 7,045,060 B1 | 5/2006 | Liles et al. | |
| 7,163,587 B2 | 1/2007 | Kinnard et al. | |
| 7,175,713 B2 | 2/2007 | Thakur et al. | |
| 7,195,037 B2 | 3/2007 | Eidsmore | |
| 7,204,886 B2 | 4/2007 | Chen et al. | |
| 7,220,669 B2 | 5/2007 | Hujanen et al. | |
| 7,297,892 B2 | 11/2007 | Kelley et al. | |
| 7,304,263 B2 | 12/2007 | Chang et al. | |
| 7,311,851 B2 | 12/2007 | Carr | |
| 7,323,581 B1 | 1/2008 | Gardiner et al. | |
| 7,402,210 B2 | 7/2008 | Chen et al. | |
| 7,408,225 B2 | 8/2008 | Shinriki et al. | |
| 7,416,994 B2 | 8/2008 | Quick | |
| 7,494,927 B2 | 2/2009 | Kostamo et al. | |
| 7,591,907 B2 | 9/2009 | Chen et al. | |
| 7,591,957 B2 | 9/2009 | Carr | |
| 7,638,645 B2 | 12/2009 | Gordon et al. | |
| 7,670,399 B2 | 3/2010 | Park | |
| 7,780,785 B2 | 8/2010 | Chen et al. | |
| 7,780,789 B2 | 8/2010 | Wu et al. | |
| 7,846,499 B2 | 12/2010 | Blomberg | |
| 7,918,938 B2 | 4/2011 | Provencher et al. | |
| 7,927,942 B2 | 4/2011 | Raaijmakers | |
| 8,070,879 B2 | 12/2011 | Chen et al. | |
| 8,137,463 B2 | 3/2012 | Liu et al. | |
| 8,142,847 B2 | 3/2012 | Shenai-Khatkhate et al. | |
| 8,152,922 B2 | 4/2012 | Schmidt et al. | |
| 8,188,464 B2 | 5/2012 | Quick | |
| 8,211,230 B2 | 7/2012 | Verghese et al. | |
| 8,298,336 B2 | 10/2012 | Wang et al. | |
| 8,372,201 B2 | 2/2013 | Provencher et al. | |
| 8,399,056 B2 | 3/2013 | Blasco et al. | |
| 8,425,682 B2 | 4/2013 | Wang et al. | |
| 8,465,801 B2 | 6/2013 | Schmidt et al. | |
| 8,668,776 B2 | 3/2014 | Chen et al. | |
| 8,784,563 B2 | 7/2014 | Schmidt et al. | |
| 8,809,170 B2 | 8/2014 | Bauer | |
| 9,029,189 B2 | 5/2015 | Gordon et al. | |
| 9,312,154 B2 | 4/2016 | Tran et al. | |
| 9,359,672 B2 | 6/2016 | Verghese et al. | |
| 9,388,492 B2 | 7/2016 | White et al. | |
| 9,394,608 B2 | 7/2016 | Shero et al. | |
| 9,567,672 B2 | 2/2017 | Kim et al. | |
| 9,574,268 B1 | 2/2017 | Dunn et al. | |
| 9,802,220 B2 | 10/2017 | Heys et al. | |
| 9,863,039 B2 | 1/2018 | Min | |
| 9,911,590 B2 | 3/2018 | Dussarrat et al. | |
| 10,113,232 B2 | 10/2018 | Wongsenakhum et al. | |
| 10,131,984 B2 | 11/2018 | Okada | |
| 10,147,597 B1 | 12/2018 | Lee et al. | |
| 10,280,509 B2 | 5/2019 | Tzu et al. | |
| 10,358,407 B2 | 7/2019 | Hatanpaa et al. | |
| 10,370,761 B2 | 8/2019 | Dunn et al. | |
| 10,468,291 B2 | 11/2019 | Verghese et al. | |
| 10,480,072 B2 | 11/2019 | Shero et al. | |
| 10,662,527 B2 | 5/2020 | Marquardt | |

(56) References Cited

U.S. PATENT DOCUMENTS

| | | |
|---|---|---|
| 10,683,571 B2 | 6/2020 | Jdira et al. |
| 10,741,365 B2 | 8/2020 | Chandrasekharan et al. |
| 10,844,486 B2 | 11/2020 | Shero et al. |
| 11,014,866 B2 | 5/2021 | Hatanpaa et al. |
| 11,047,042 B2 | 6/2021 | McKee et al. |
| 2001/0003015 A1 | 6/2001 | Chang et al. |
| 2001/0006093 A1 | 7/2001 | Tabuchi et al. |
| 2001/0054377 A1 | 12/2001 | Lindfors et al. |
| 2002/0007790 A1 | 1/2002 | Park |
| 2002/0072164 A1 | 6/2002 | Umotoy et al. |
| 2002/0081381 A1 | 6/2002 | DelaRosa et al. |
| 2002/0113327 A1 | 8/2002 | Hara |
| 2002/0170674 A1 | 11/2002 | Shapiro |
| 2002/0195055 A1 | 12/2002 | Grant et al. |
| 2003/0008072 A1 | 1/2003 | Lee et al. |
| 2003/0010451 A1 | 1/2003 | Tzu et al. |
| 2003/0019428 A1 | 1/2003 | Ku et al. |
| 2003/0056720 A1 | 3/2003 | Dauelsberg et al. |
| 2003/0070620 A1 | 4/2003 | Cooperberg et al. |
| 2003/0079686 A1 | 5/2003 | Chen et al. |
| 2003/0101938 A1 | 6/2003 | Ronsse et al. |
| 2003/0106643 A1 | 6/2003 | Tabuchi et al. |
| 2003/0172872 A1 | 9/2003 | Thakur et al. |
| 2003/0180460 A1 | 9/2003 | Strauch et al. |
| 2003/0194360 A1 | 10/2003 | Huziwara et al. |
| 2003/0205096 A1 | 11/2003 | Gehner et al. |
| 2004/0016404 A1 | 1/2004 | Gregg et al. |
| 2004/0028810 A1 | 2/2004 | Grant et al. |
| 2004/0035358 A1 | 2/2004 | Basceri et al. |
| 2004/0043557 A1 | 3/2004 | Haukka et al. |
| 2004/0113289 A1 | 6/2004 | Toda et al. |
| 2004/0118342 A1 | 6/2004 | Cheng et al. |
| 2004/0144311 A1 | 7/2004 | Chen et al. |
| 2004/0197090 A1 | 10/2004 | Kudo |
| 2004/0217217 A1 | 11/2004 | Han et al. |
| 2004/0221807 A1 | 11/2004 | Verghese et al. |
| 2004/0224504 A1 | 11/2004 | Gadgil |
| 2005/0000428 A1 | 1/2005 | Shero et al. |
| 2005/0000656 A1 | 1/2005 | Carr |
| 2005/0009325 A1 | 1/2005 | Chung et al. |
| 2005/0092247 A1 | 5/2005 | Schmidt et al. |
| 2005/0173068 A1 | 8/2005 | Chen et al. |
| 2005/0208217 A1 | 9/2005 | Shinriki et al. |
| 2005/0241176 A1 | 11/2005 | Shero et al. |
| 2005/0252449 A1 | 11/2005 | Nguyen et al. |
| 2005/0263197 A1 | 12/2005 | Eidsmore |
| 2005/0271812 A1 | 12/2005 | Myo et al. |
| 2006/0053833 A1 | 3/2006 | Martins et al. |
| 2006/0096540 A1 | 5/2006 | Choi |
| 2006/0266289 A1 | 11/2006 | Verghese et al. |
| 2007/0001326 A1 | 1/2007 | Toda et al. |
| 2007/0026147 A1 | 2/2007 | Chen et al. |
| 2007/0081923 A1 | 4/2007 | Choe et al. |
| 2007/0095285 A1 | 5/2007 | Thakur et al. |
| 2007/0098894 A1 | 5/2007 | Verghese et al. |
| 2007/0128864 A1 | 6/2007 | Ma et al. |
| 2007/0187634 A1 | 8/2007 | Sneh |
| 2007/0194470 A1 | 8/2007 | Dedontney |
| 2008/0037968 A1 | 2/2008 | Kaastra |
| 2008/0085226 A1 | 4/2008 | Fondurulia et al. |
| 2008/0102203 A1* | 5/2008 | Wu .................. C23C 16/45502 118/728 |
| 2008/0102208 A1 | 5/2008 | Wu et al. |
| 2008/0115740 A1 | 5/2008 | You |
| 2008/0202416 A1 | 8/2008 | Provencher et al. |
| 2008/0241387 A1 | 10/2008 | Keto |
| 2008/0254218 A1 | 10/2008 | Xinjian et al. |
| 2008/0271610 A1 | 11/2008 | Vedsted et al. |
| 2009/0095222 A1 | 4/2009 | Tam et al. |
| 2009/0196992 A1 | 8/2009 | Schmidt et al. |
| 2009/0215912 A1 | 8/2009 | Goto et al. |
| 2009/0320754 A1 | 12/2009 | Oya et al. |
| 2010/0003406 A1 | 1/2010 | Lam et al. |
| 2010/0024727 A1 | 2/2010 | Kim et al. |
| 2010/0048032 A1 | 2/2010 | Sangam et al. |
| 2010/0092163 A1 | 4/2010 | Yeung |
| 2010/0150756 A1 | 6/2010 | Chow et al. |
| 2010/0255198 A1 | 10/2010 | Cleary et al. |
| 2010/0266765 A1 | 10/2010 | White et al. |
| 2010/0296800 A1 | 11/2010 | Min et al. |
| 2010/0310772 A1 | 12/2010 | Tsuda |
| 2011/0098841 A1 | 4/2011 | Tsuda |
| 2011/0111136 A1 | 5/2011 | Slevin et al. |
| 2011/0116776 A1 | 5/2011 | Wheeler et al. |
| 2011/0128814 A1 | 6/2011 | Hanada |
| 2011/0162580 A1 | 7/2011 | Provencher et al. |
| 2011/0199855 A1 | 8/2011 | Hanada |
| 2011/0223334 A1 | 9/2011 | Yudovsky et al. |
| 2012/0079984 A1 | 4/2012 | Schmidt et al. |
| 2012/0289057 A1 | 11/2012 | DeDeontney |
| 2012/0307589 A1 | 12/2012 | Hanada |
| 2013/0058835 A1 | 3/2013 | Salazar-Guillen et al. |
| 2013/0061759 A1 | 3/2013 | Laor et al. |
| 2013/0091933 A1 | 4/2013 | Tsukada et al. |
| 2013/0160709 A1 | 6/2013 | White et al. |
| 2013/0206338 A1 | 8/2013 | Tanaka |
| 2013/0333620 A1 | 12/2013 | Li et al. |
| 2013/0333768 A1 | 12/2013 | Chandrasekharan et al. |
| 2014/0120031 A1 | 5/2014 | Yang et al. |
| 2014/0141165 A1 | 5/2014 | Sato et al. |
| 2014/0261178 A1 | 9/2014 | Du Bois et al. |
| 2014/0284404 A1 | 9/2014 | Kuah et al. |
| 2015/0104161 A1 | 4/2015 | De Mango et al. |
| 2015/0176126 A1 | 6/2015 | Ge et al. |
| 2015/0211112 A1 | 7/2015 | Cadot et al. |
| 2015/0232355 A1 | 8/2015 | Ghaffour et al. |
| 2015/0240359 A1 | 8/2015 | Jdira |
| 2015/0371831 A1 | 12/2015 | Rozenzon et al. |
| 2015/0377481 A1 | 12/2015 | Smith et al. |
| 2016/0108523 A1 | 4/2016 | Lee et al. |
| 2016/0122868 A1 | 5/2016 | Kim et al. |
| 2016/0222508 A1 | 8/2016 | Schoepp et al. |
| 2016/0256889 A1 | 9/2016 | Jones |
| 2016/0281232 A1 | 9/2016 | White et al. |
| 2017/0121818 A1 | 5/2017 | Dunn et al. |
| 2017/0216796 A1 | 8/2017 | Sameshima |
| 2017/0350011 A1 | 12/2017 | Marquardt |
| 2019/0032206 A1 | 1/2019 | Hodges et al. |
| 2019/0195378 A1 | 6/2019 | Aikawa et al. |
| 2019/0264326 A1 | 8/2019 | Doya |
| 2020/0056286 A1 | 2/2020 | Shero et al. |
| 2020/0248308 A1 | 8/2020 | Marquardt |
| 2020/0299836 A1 | 9/2020 | Nandwana et al. |
| 2020/0354835 A1 | 11/2020 | Watanabe et al. |
| 2021/0118668 A1 | 4/2021 | Nandwana et al. |

FOREIGN PATENT DOCUMENTS

| | | |
|---|---|---|
| JP | 2011-104483 | 6/2011 |
| JP | 2011-246466 | 12/2011 |
| JP | 2012-099594 | 5/2012 |
| JP | 2013-075281 | 4/2013 |
| KR | 10-1464173 | 11/2014 |
| KR | 2015-0126789 | 11/2015 |
| KR | 2016-0016622 | 2/2016 |
| WO | WO 1990/10092 | 9/1990 |
| WO | WO 1996/40690 | 12/1996 |
| WO | WO 2001/29282 | 4/2001 |
| WO | WO 2002/18394 | 3/2002 |
| WO | WO 2008/002546 | 1/2008 |
| WO | WO 2010/047168 | 4/2010 |
| WO | WO 2010/114386 | 10/2010 |
| WO | WO 2014/163742 | 10/2014 |
| WO | WO 2013/111789 | 5/2015 |

OTHER PUBLICATIONS

Bonsu et al., "Synthesis and evaluation of K2-β-diketonate and β-ketoesterate tungsten(VI) oxo-alkoxide complexes as precursors for chemical vapor deposition of WOx thin films", Dalton Trans., 2016, 45, pp. 10897-10908.

Browning et al., "Atomic layer deposition of MoS2 films", Mater. Res. Express 2, 2015, 6 pages.

(56) References Cited

OTHER PUBLICATIONS

Buono-Core et al., "Synthesis and evaluation of bis-β-diketonate dioxotungsten(VI) complexes as precursors for the photodeposition of WO3 films", Polyhedron, 30, 2011, pp. 201-206.

Chisholm et al., "The Molybdenum-Molybdenum Triple Bond. 13.1 Preparations and Characterization of Bis(P-diketonato)tetraalkoxydimolybdenum and -ditungsten Compounds", Inorg. Chem., 1984, 23, pp. 613-618.

Chisholm et al., "Reactions of Metal-Metal Multiple Bonds. 11.1 A Comparison of the Reactivity of M2(OR)6 (M≡M) and M2(OR)4(R'COCHCOR'2 (M≡M) Compounds (M = Mu, W) with the π-Acid Ligands CO, RC≡CR, and RNC", Inorg. Chem., 1984, 23, pp. 1037-1042.

Doyle, "The Reaction of Some Molybdenum and Tungsten Halides with .beta.-Diketones", Inorganic Chemistry, vol. 10, No. 10, 1971, pp. 2348-2350.

Kang et al., "High-mobility three-atom-thick semiconducting films with wafer-scale homogeneity", Nature, April 30, 2015, vol. 520, pp. 656-660.

Lee et al., "Effects of Oxidation State and Crystallinity of Tugsten Oxide Interlayer on Photovoltaic Property in Bulk Hetero-Junction Solar Cell", J. Phys. Chem. 2012, 116, pp. 13480-13487.

Mazurenko et al., "Synthesis, thermal stability, and IR and UV spectra of molybdenum and tungsten β-diketone complexes", Probl. Khim. Primen. β [Beta]-Diketonatov Met., (Mater. Vses. Semin.) (1982).

Zelazowlska et al., "WO3-based electrochromic system with hybrid organic-inorganic gel electrolytes", Journal of Non-Crystalline Solids, 354, 2008, pp. 4500-4505.

\* cited by examiner

SEMICONDUCTOR DEPOSITION REACTOR MANIFOLDS

CROSS-REFERENCE TO RELATED APPLICATIONS

Any and all applications for which a foreign or domestic priority claim is identified in the Application Data Sheet as filed with the present application are hereby incorporated by reference under 37 C.F.R. § 1.57.

BACKGROUND

Field

The field relates generally to manifolds for vapor deposition, and, in particular, to manifolds for improving the quality of deposition in an atomic layer deposition (ALD) reactor.

Description of the Related Art

There are several vapor deposition methods for depositing thin films on surfaces of substrates. These methods include vacuum evaporation deposition, Molecular Beam Epitaxy (MBE), different variants of Chemical Vapor Deposition (CVD) (including low-pressure and organometallic CVD and plasma-enhanced CVD), and Atomic Layer Deposition (ALD).

In an ALD process, one or more substrates with at least one surface to be coated are introduced into a deposition chamber. The substrate is heated to a desired temperature, typically above the condensation temperatures of the selected vapor phase reactants and below their thermal decomposition temperatures. One reactant is capable of reacting with the adsorbed species of a prior reactant to form a desired product on the substrate surface. Two, three or more reactants are provided to the substrate, typically in spatially and temporally separated pulses.

In an example, in a first pulse, a first reactant representing a precursor material is adsorbed largely intact in a self-limiting process on a wafer. The process is self-limiting because the vapor phase precursor cannot react with or adsorb upon the adsorbed portion of the precursor. After any remaining first reactant is removed from the wafer or chamber, the adsorbed precursor material on the substrate reacted with a subsequent reactant pulse to form no more than a single molecular layer of the desired material. The subsequent reactant may, e.g., strip ligands from the adsorbed precursor material to make the surface reactive again, replace ligands and leave additional material for a compound, etc. In an unadulterated ALD process, less than a monolayer is formed per cycle on average due to steric hindrance, whereby the size of the precursor molecules prevent access to adsorption sites on the substrate, which may become available in subsequent cycles. Thicker films are produced through repeated growth cycles until the target thickness is achieved. Growth rate is often provided in terms of angstroms per cycle because in theory the growth depends solely on number of cycles, and has no dependence upon mass supplied or temperature, as long as each pulse is saturative and the temperature is within the ideal ALD temperature window for those reactants (no thermal decomposition and no condensation).

Reactants and temperatures are typically selected to avoid both condensation and thermal decomposition of the reactants during the process, such that chemical reaction is responsible for growth through multiple cycles. However, in certain variations on ALD processing, conditions can be selected to vary growth rates per cycle, possibly beyond one molecular monolayer per cycle, by utilizing hybrid CVD and ALD reaction mechanisms. Other variations may be allow some amount of spatial and/or temporal overlap between the reactants. In ALD and other sequential vapor deposition variations thereof, two, three, four or more reactants can be supplied in sequence in a single cycle, and the content of different cycles can be varied to tailor composition.

During a typical ALD process, the reactant pulses, all of which are in vapor form, are pulsed sequentially into a reaction space (e.g., reaction chamber) with removal steps between reactant pulses to avoid direct interaction between reactants in the vapor phase. For example, inert gas pulses or "purge" pulses can be provided between the pulses of reactants. The inert gas purges the chamber of one reactant pulse before the next reactant pulse to avoid gas phase mixing. To obtain a self-limiting growth, a sufficient amount of each precursor is provided to saturate the substrate. As the growth rate in each cycle of a true ALD process is self-limiting, the rate of growth is proportional to the repetition rate of the reaction sequences rather than to the flux of reactant.

SUMMARY

In one aspect a semiconductor processing device is provided which includes: a manifold including: a bore configured to deliver vaporized reactant to a reaction chamber, the bore extending along a longitudinal axis; an upper wall disposed at an upper portion of the manifold, the upper wall defining a capping surface at a first end of the bore along the longitudinal axis; an outlet at a lower portion of the manifold along the longitudinal axis, the outlet configured to deliver gas to a reactor; a first supply channel configured to supply gas to the bore; and a second supply channel configured to supply gas to the bore, wherein the first supply channel and the second supply channel merge with the bore at offset positions along the longitudinal axis.

In some embodiments, the capping surface is shaped to redirect upwardly directed gas downwardly back through the bore to the outlet.

In some embodiments, the semiconductor processing device further includes a first block mounted to the manifold, the first block and the manifold cooperating to at least partially define the first supply channel. In some embodiments, the semiconductor processing device further includes a second block mounted to the manifold, the second block and the manifold cooperating to at least partially define the second supply channel.

In some embodiments, the first supply channel is in fluid communication with a first reactant source and is configured to deliver a first vaporized reactant to the bore, and the second supply channel is in fluid communication with a second reactant source and is configured to deliver a second vaporized reactant to the bore.

In some embodiments, the first supply channel is in fluid communication with an inactive gas to purge the bore.

In some embodiments, the semiconductor processing device further includes a showerhead device below the outlet, the showerhead device configured to disperse a flow of the gas from the outlet. The semiconductor processing device can further include a reaction chamber below the showerhead device and a substrate support configured to support a substrate in the reaction chamber.

In some embodiments, the first block includes a first vapor phase inlet configured to input a first reactant into the first supply channel.

In some embodiments, the first block further includes a second vapor phase inlet and a third vapor phase inlet. In some embodiments, the first block further includes a fourth vapor phase inlet, wherein the fourth vapor phase inlet is located on a lateral side of the first block opposite to the manifold.

In some embodiments, the fourth vapor phase inlet is configured to input a purge gas into the manifold.

In some embodiments, the first supply channel is angled towards the capping surface and the second supply channel is angled towards the outlet, the second supply channel downstream of the first supply channel.

In some embodiments, the manifold includes a single monolithic block.

In some embodiments, the bore extends continuously along the longitudinal axis.

In another aspect, a semiconductor processing device is provided which includes: a manifold including a bore configured to deliver gas to a reaction chamber, the bore disposed along a longitudinal axis; an upper wall disposed at an upper portion of the manifold, the upper wall defining a capping surface at a first end of the bore along the longitudinal axis; a first supply line configured to supply an inactive purge gas to the bore at a first location along the longitudinal axis downstream of the capping surface; a second supply line configured to supply a gas to the bore at a second location along the longitudinal axis, the second location different from the first location.

In some embodiments, the supply line is connected to an inactive gas source to purge the bore.

In some embodiments, the inactive gas comprises at least one of argon gas and nitrogen gas.

In another aspect, a method of deposition, is provided. The method includes: supplying a first gas through a first supply channel to a bore of a manifold at a first location along a longitudinal axis of the bore, a capping surface disposed at an upper end of the bore; supplying a second gas through a second supply channel to the bore of the manifold at a second location along the longitudinal axis of the bore that is longitudinally offset from the first supply channel; directing at least one of the first gas and the second gas downstream along the longitudinal axis towards an outlet of the bore.

In some embodiments, supplying the first and second gases comprises supplying a first vaporized reactant and supplying a second vaporized reactant. In some embodiments, the method further includes purging the reaction chamber with an inactive gas after supplying the first vaporized reactant and before supplying the second vaporized reactant. The inactive gas can include at least one of nitrogen gas and argon gas. The first vaporized reactant can include at least one of $H_2$, $NH_3$, $N_2$, $O_2$, or O. The second vaporized reactant can include at least one of dichlorosilane (DCS), trichlorosilane (TCS), trisilane, organic silanes, titanium chloride ($TiCl_4$), $ZrCl_4$, and $HfCl_4$. The first vaporized reactant can include $NH_3$ and the second vaporized reactant can include $TiCl_4$. In some embodiments, the method includes vaporizing liquid $TiCl_4$ to create the second vaporized reactant.

BRIEF DESCRIPTION OF THE DRAWINGS

These and other features, aspects and advantages of the present invention will now be described with reference to the drawings of several embodiments, which embodiments are intended to illustrate and not to limit the invention.

DETAILED DESCRIPTION

Figure 1:
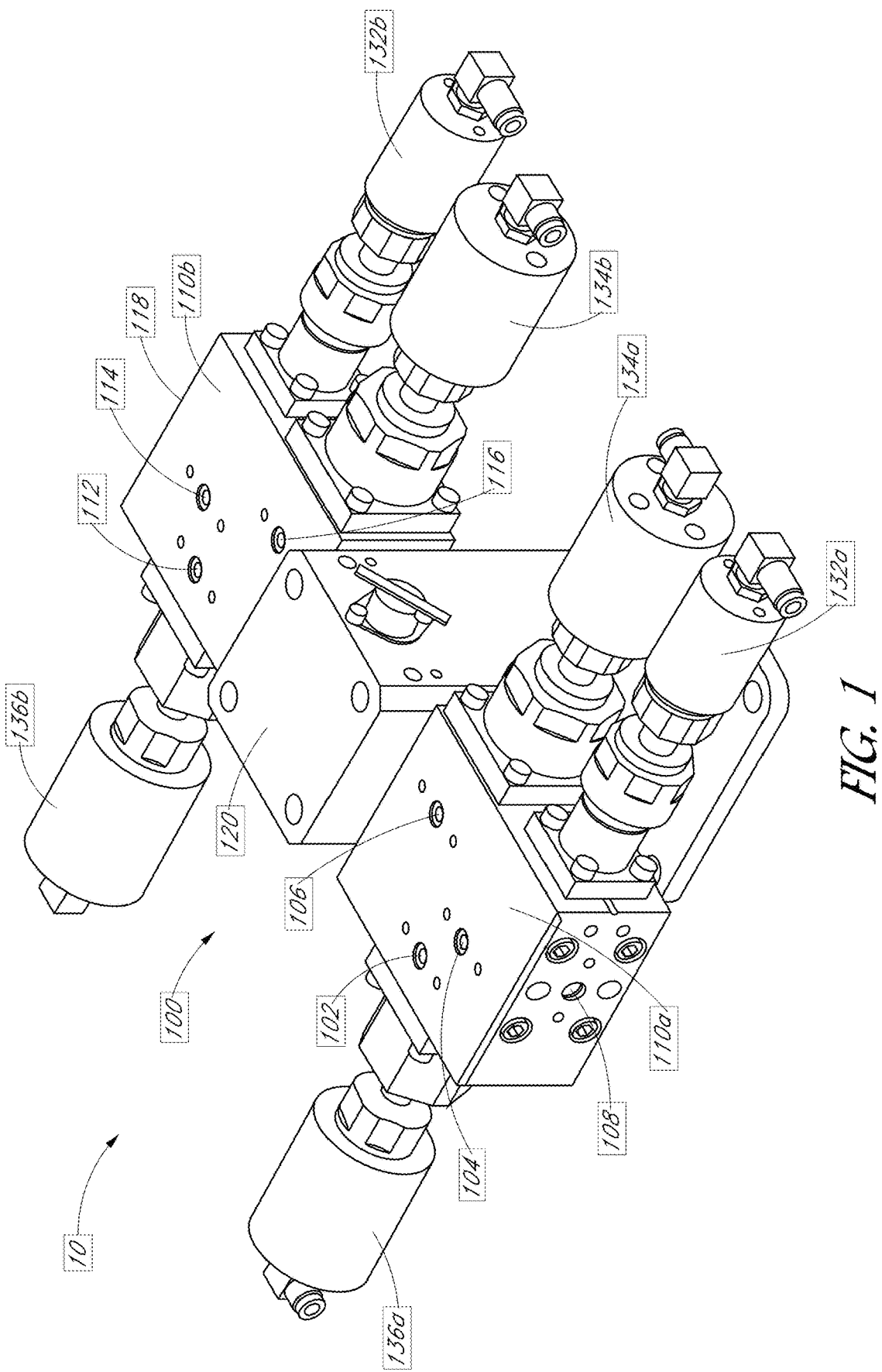
FIG. 1 is a schematic perspective view of an illustrative embodiment of a semiconductor processing device.

The embodiments disclosed herein can be utilized with semiconductor processing devices configured for any suitable gas or vapor deposition process, including processes that alternate reactant exposures (e.g., pulses) to the substrate. For example, the illustrated embodiments show various systems for depositing material on a substrate using atomic layer deposition (ALD) techniques. Among vapor deposition techniques, ALD has many advantages, including high conformity at low temperatures and fine control of composition during the process. ALD type processes are based on controlled, self-limiting surface reactions of precursor chemicals. Gas phase reactions are avoided by feeding the precursors alternately and sequentially into the reaction chamber. Vapor phase reactants are separated from each other in the reaction chamber, for example, by removing excess reactants and/or reactant by-products from the reaction chamber between reactant pulses. Removal can be accomplished by a variety of techniques, including purging and/or lowering pressure between pulses. Pulses can be sequential in a continuous flow, or the reactor can be isolated and can backfilled for each pulse. Of course, the equipment disclosed herein can be useful for other vapor deposition processes, particularly those in which alternation of reactants is desired, such that processes employed by the equipment may include some degree of thermal decomposition and/or overlap of precursor spatially or temporally.

Briefly, a substrate is loaded into a reaction chamber and is heated to a suitable deposition temperature, generally at lowered pressure. Deposition temperatures are typically maintained below the precursor thermal decomposition temperature but at a high enough level to avoid condensation of reactants and to provide the activation energy for the desired surface reactions. Of course, the appropriate temperature window for any given ALD reaction will depend upon the surface termination and reactant species involved, and processes that allow for either condensation or thermal decomposition can be conducted with equipment described herein.

A first reactant can be conducted into the chamber in the form of a vapor phase pulse and contacted with the surface of a substrate. Any suitable reactant vapor can be pulsed into the chamber. In various embodiments, for example, the first vaporized reactant can comprise ammonia ($NH_3$). Conditions can be selected such that no more than about one monolayer of the precursor is adsorbed on the substrate surface in a self-limiting manner. Excess first reactant and reaction byproducts, if any, are purged from the reaction chamber, often with a pulse of inert gas such as nitrogen or argon.

Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times for a single wafer reactor are from about 0.05 to 20 seconds, particularly between about 1 and 10 seconds, and still more particularly between about 1 and 2 seconds. However, other purge times can be utilized if desired, such as when depositing layers over extremely high aspect ratio structures or other structures with complex surface morphology is needed, or when a high volume batch reactor is employed. The appropriate pulsing times can be readily determined by the skilled artisan based on the particular circumstances.

A second gaseous reactant can be pulsed into the chamber where it reacts with the first reactant bound to the surface. Any suitable reactant vapor can be pulsed into the chamber. In various embodiments, for example, the second vaporized reactant can comprise titanium chloride, or $TiCl_4$. Excess second reactant and gaseous by-products of the surface reaction are purged out of the reaction chamber, preferably with the aid of an inert gas. The steps of pulsing and purging are repeated until a thin film of the desired thickness has been formed on the substrate, with each cycle leaving no more than a molecular monolayer. Some ALD processes can have more complex sequences with three or more precursor pulses alternated, where each precursor contributes elements to the growing film. Reactants can also be supplied in their own pulses or with precursor pulses to strip or getter adhered ligands and/or free by-product, rather than contribute elements to the film. Additionally, not all cycles need to be identical. For example, a binary film can be doped with a third element by infrequent addition of a third reactant pulse, e.g., every fifth cycle, in order to control stoichiometry of the film, and the frequency can change during the deposition in order to grade film composition. Moreover, while described as starting with an adsorbing reactant, some recipes may start with the other reactant or with a separate surface treatment, for example to ensure maximal reaction sites to initiate the ALD reactions (e.g., for certain recipes, a water pulse can provide hydroxyl groups on the substrate to enhance reactivity for certain ALD precursors).

As mentioned above, each pulse or phase of each cycle is preferably self-limiting for ALD reactions. An excess of reactant precursors is supplied in each phase to saturate the susceptible structure surfaces. Surface saturation ensures reactant occupation of all available reactive sites (subject, for example, to physical size or steric hindrance restraints) and thus ensures excellent step coverage over any topography on the substrate. In some arrangements, the degree of self-limiting behavior can be adjusted by, e.g., allowing some overlap of reactant pulses to trade off deposition speed (by allowing some CVD-type reactions) against conformity. Ideal ALD conditions with reactants well separated in time and space provide near perfect self-limiting behavior and thus maximum conformity, but steric hindrance results in less than one molecular layer per cycle. Limited CVD reactions mixed with the self-limiting ALD reactions can raise the deposition speed. While embodiments described herein are particularly advantageous for sequentially pulsed deposition techniques, like ALD and mixed-mode ALD/CVD, the manifold can also be employed for pulsed or continuous CVD processing. Many kinds of reactors capable of ALD growth of thin films, including CVD reactors equipped with appropriate equipment and means for pulsing the precursors, can be employed. In some embodiments a flow type ALD reactor is used, as compared to a backfilled reactor. In some embodiments, the manifold is upstream of an injector designed to distribute gas into the reaction space, particularly a dispersion mechanism such as a showerhead assembly above a single-wafer reaction space.

The ALD processes can optionally be carried out in a reaction chamber or space connected to a cluster tool. In a cluster tool, because each reaction space is dedicated to one type of process, the temperature of the reaction space in each module can be kept constant, which improves the throughput compared to a reactor in which the substrate is heated to the process temperature before each run. A stand-alone reactor can be equipped with a load-lock. In that case, it is not necessary to cool down the reaction chamber or space between each run. These processes can also be carried out in a reactor designed to process multiple substrates simultaneously, e.g., a mini-batch type showerhead reactor.

Various embodiments disclosed herein relate to a semiconductor device, such as a vapor deposition device (e.g., an ALD device, a CVD device, etc.), that includes a manifold for delivering reactant vapor(s) to a reaction chamber. Regardless of the natural state of the chemicals under standard conditions, the reactant vapors may be referred to as "gases" herein. The embodiments disclosed herein can beneficially provide the first reactant and the second reactant through a first supply channel and a second supply channel, respectively, that are offset from each other along a bore of the manifold. The first and second supply channels can supply first and second reactant vapors, respectively, to the manifold. Moreover, the first and second supply channels can also supply purge gas(es) (for example, inert carrier gases) to the manifold to purge the manifold and supply channels of reactant. As explained herein, the offset nature of the first supply channel and second supply channel allows for reduced penetration of the first reactant into the second supply channel and the second reactant into the first supply channel. Penetration of the first reactant into the second supply channel and the second reactant into the second supply channel may cause cross contamination of reactants in the supply channels which can lead to poor deposition quality. Increased offset between the supply channels can reduce penetration of reactants into opposing supply channels.

Further, in various embodiments, the manifold includes an intermediate block surrounded by two valve blocks.

Purge gas inlets are provided on surfaces of the valve blocks that are opposite to the surface where the intermediate block and the two valve blocks meet.

FIG. 1 is a perspective view of a semiconductor process device 10 that can include a manifold 100 to deliver gases to a reaction chamber (not shown). The major components of FIG. 1 are described in detail below in connection with the description of FIGS. 4B and 5B. For example, the semiconductor processing device 10 can include a manifold 100 comprising a manifold body 120. First and second valve blocks 110a, 110b can be mounted to the manifold body 120 and can include one or a plurality of vapor phase inlets to deliver reactant vapor and/or inactive gas (e.g., purge gas) to the manifold body 120. The semiconductor processing device 10 can include a plurality of valves to control the delivery of reactant vapor and inactive gas to the manifold body 120. For example, as described herein, the device 10 can comprise inert gas valves 132a, 132b to control the supply of inactive gas to the manifold 100, reactant gas valves 134a, 134b to control the supply of reactant vapor to the manifold 100, and first and second valves 136a, 136b to control the supply of etchant and coating vapors to the manifold 100.

In various arrangements, one of the first and second valves 136a, 136b can control the flow of etchant(s) from a remote plasma unit (RPU) to periodically clean surfaces of the reaction chamber of deposits (e.g., after every wafer, or after every set number of wafers being processed). The etchant can be activated in the RPU and supplied to the manifold 100 and reaction chamber. In various arrangements, the other of the first and second valves 136a, 136b can control the flow of a coating precursor (such as trimethylaluminum, or TMA) which, along with an oxygen source (such as water, remote activated oxygen, ozone, etc.), can be used to periodically coat the chamber with a protective coating (such as aluminum oxide) to deactivate chamber walls, to reduce deposition on the chamber walls, and/or to protect the chamber walls from other chemicals such as etchants.

Figure 2:
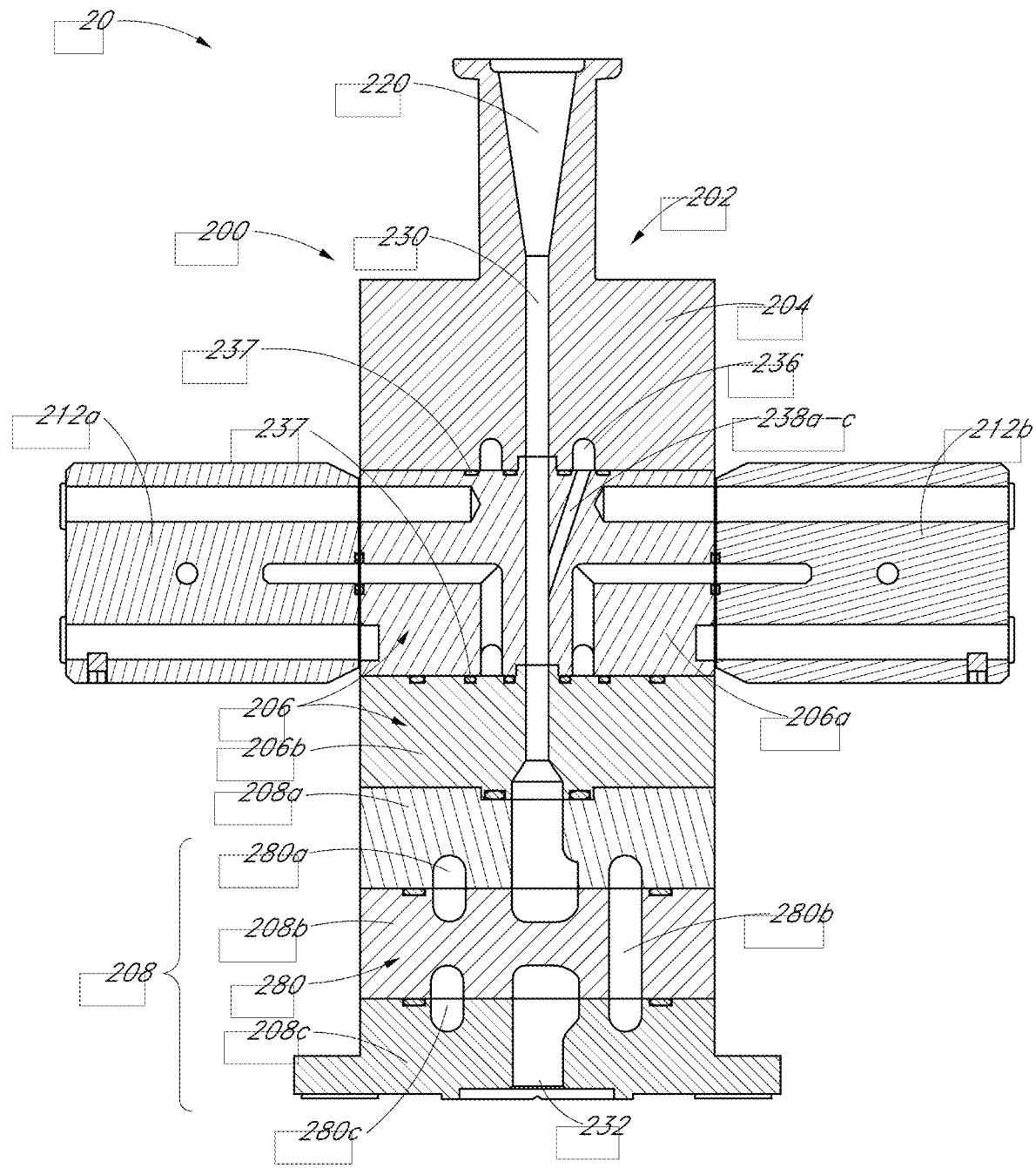
FIG. 2 is a schematic side sectional view of a semiconductor processing device having an inactive gas inlet at an upper portion of a manifold body.

FIG. 2 is a schematic side sectional view of a semiconductor processing device 20 that can include a manifold 200 to deliver a gas to a reaction chamber (not shown). The semiconductor processing device 20 and manifold 200 shown in FIG. 2 may be generally similar to the semiconductor processing devices and manifolds shown in and described in U.S. Pat. No. 9,574,268 and U.S. Patent Publication No. US 2017-0350011, the disclosures of which are incorporated by reference herein in their entirety and for all purposes. There may be various differences between the manifolds described in U.S. Patent Publication No. US 2017-0350011 and the manifold 200 of FIG. 2, but the overall functionality and design may be similar to, e.g., FIGS. 6A-6J and/or FIGS. 8A-8F of U.S. Patent Publication No. US 2017-0350011. Furthermore, the manifold of the present disclosure can be combined with the valves of FIG. 2 of U.S. Patent Publication No. US 2017-0350011; and/or combined with the reactant/inert gas sources, gas dispersion mechanism, controller, reaction chamber and vacuum source of FIG. 3A of the U.S. Patent Publication No. US 2017-0350011.

The manifold 200 can include the manifold body 202 connected with valve blocks 212a, 212b, shown on opposite sides of the manifold body 202. Reactant valves and inert gas valves (not shown) are disposed on the blocks 212a, 212b, or on other upstream blocks (not shown). An inert gas inlet 220 can supply inert gas to the manifold 200, for example, from an upper portion of the manifold 200. The manifold body 202 comprises multiple blocks stacked on one another to at least partially define a bore 230 along which gas(es) flow, including, for example, an upper block 204, an intermediate block 206, and a lower block 208. In the arrangement of FIG. 2A, the intermediate block 206 comprises a sub-block 206a and a sub-block 206b mechanically connected to the sub-block 206a. The lower block 208 comprises a first sub-block 208a, a second sub-block 208b mechanically connected to the first sub-block 208a, and a third sub-block 208c mechanically connected to the second sub-block 208b. The use of multiple blocks and sub-blocks can enable a modular construction of the manifold 200 which can enable the use of internal channels with curved or angled shapes and other internal lumens.

FIG. 2 is a modified version of the manifold described with respect to FIGS. 6A-6J of U.S. Patent Publication No. US 2017-0350011. The sub-blocks 208a-208c can define an extended mixing length pathway 280 having a first lateral portion 280a, an offset axial portion 280b, and a second lateral portion 280b. The pathway 280 can provide an extended mixing length downstream of where the supply gases are introduced to the bore 230. The manifold 200 can include a plurality of gas distribution channels, including gas distribution channel 236 shown in FIG. 2A. Supply channels 238a-c convey gases from the distribution channel 236 to the bore 230. As shown, the supply channels 238a-c comprise angled supply channels that are angled downwardly to join the bore 230, where the flow is also downward toward an outlet 232. In the arrangement of FIG. 2, gas flows through the bore 230, including along the extended mixing length pathway 280, and exits the manifold 200 through the outlet 232. The outlet 232 can be disposed over a dispersion mechanism, such as a showerhead, which can disperse the gas over the substrate in a reaction chamber (not shown).

Although the arrangement of FIG. 2 can beneficially provide an extended mixing length, the extended mixing length pathway 280 and other pathways in the manifold 200 includes curvature and turns which may introduce dead volumes, for example, during purging of reactant gases. The formation of dead volumes can reduce the efficiency and effectiveness of the deposition process. The curved and angled flow pathways of the arrangement shown in FIG. 2 may also create a "throw" onto the substrate. For example, the use of the curved pathway 280 can impart angular momentum to the gas, which can introduce non-uniformities on the substrate.

Moreover, as shown in FIG. 2, the manifold 200 utilizes a funnel shaped structure as the inactive gas inlet 220 at the top of the bore 230 to introduce purge gas in order to purge the system. However, during injection of the first reactant and/or the second reactant for some processes, the purge gas injected through the inactive gas inlet 220 may not be sufficient, and a dead volume may be present at the top of the bore 230 such that supplied reactant vapor can back-flow into the funnel-shaped inlet 220. The use of o-rings 237 between blocks 204, 206 can further increase the dead volume within the inlet 220. These dead volumes may not be effectively purged from purge gas introduced from the inactive gas inlet 220. Parasitic chemical vapor deposition (CVD) of the reactants along portions of the inlet 220 during injection of the first reactant and/or the second reactant can degrade the performance of the device 20.

Figures 3A, 3B, 3C:
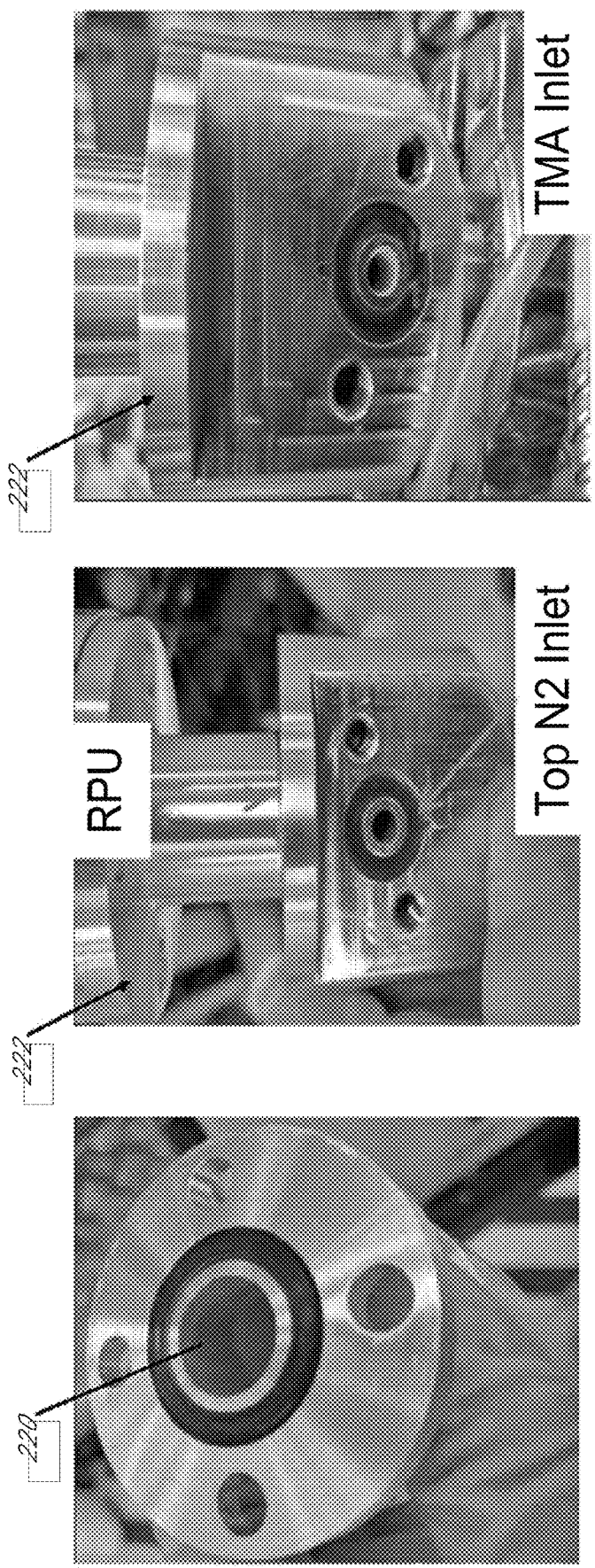
FIGS. 3A-C are images of various components of the semiconductor processing device of FIG. 2.

FIG. 3A depicts the parasitic deposition of reactant along portions of the inactive gas inlet 220 in the form of a yellow adduct formed within the funnel 220. Further, FIG. 3B shows a block 222 that connects to the top of the funnel 220 which supplies the purge gas into the funnel 220. Yellow adduct indicative of deposited reactant can be seen formed in a first inlet which supplies an inactive gas (e.g., a nitrogen gas, an argon gas, or other inactive gas) to the funnel 220. FIG. 3C shows another side of the block 222 where a second inlet (e.g., an inlet for trimethylaluminium, or TMA) is located. TMA can be supplied to the reactor to form a protective coating on chamber walls, for example, a protective aluminum oxide coating. In some arrangements, the TMA can be applied to the chamber after a set number of cleanings. Yellow adduct can be seen formed in the second inlet which supplies TMA to the system. It can be difficult to remove the illustrated adduct along the inlet 220, which can contaminate the substrate and degrade device quality. Accordingly, there is a need for improved delivery of gases to the reactor.

Figure 4A:
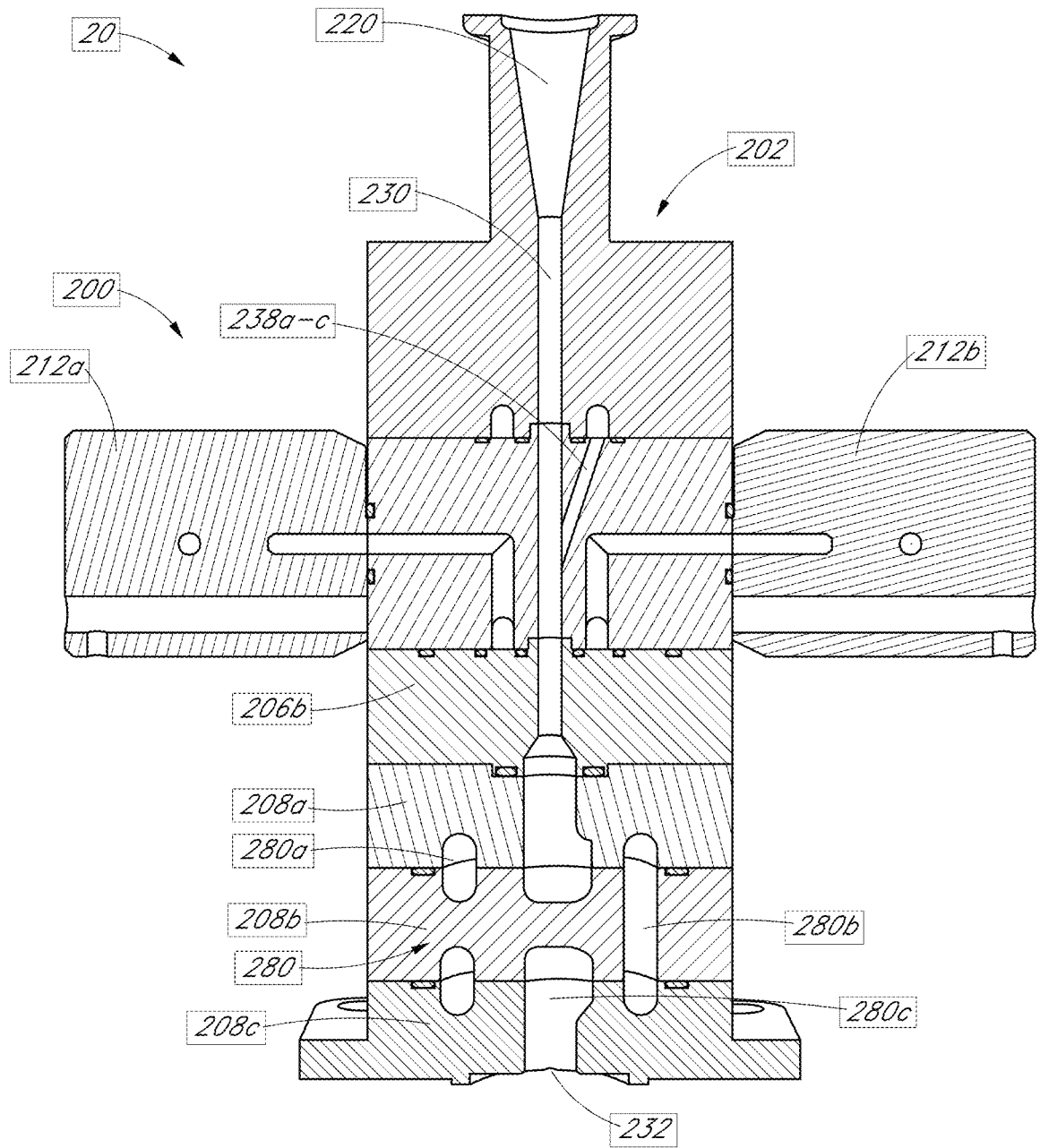
FIG. 4A is an additional cross-sectional view of the semiconductor processing device of FIG. 2.
Figure 4B:
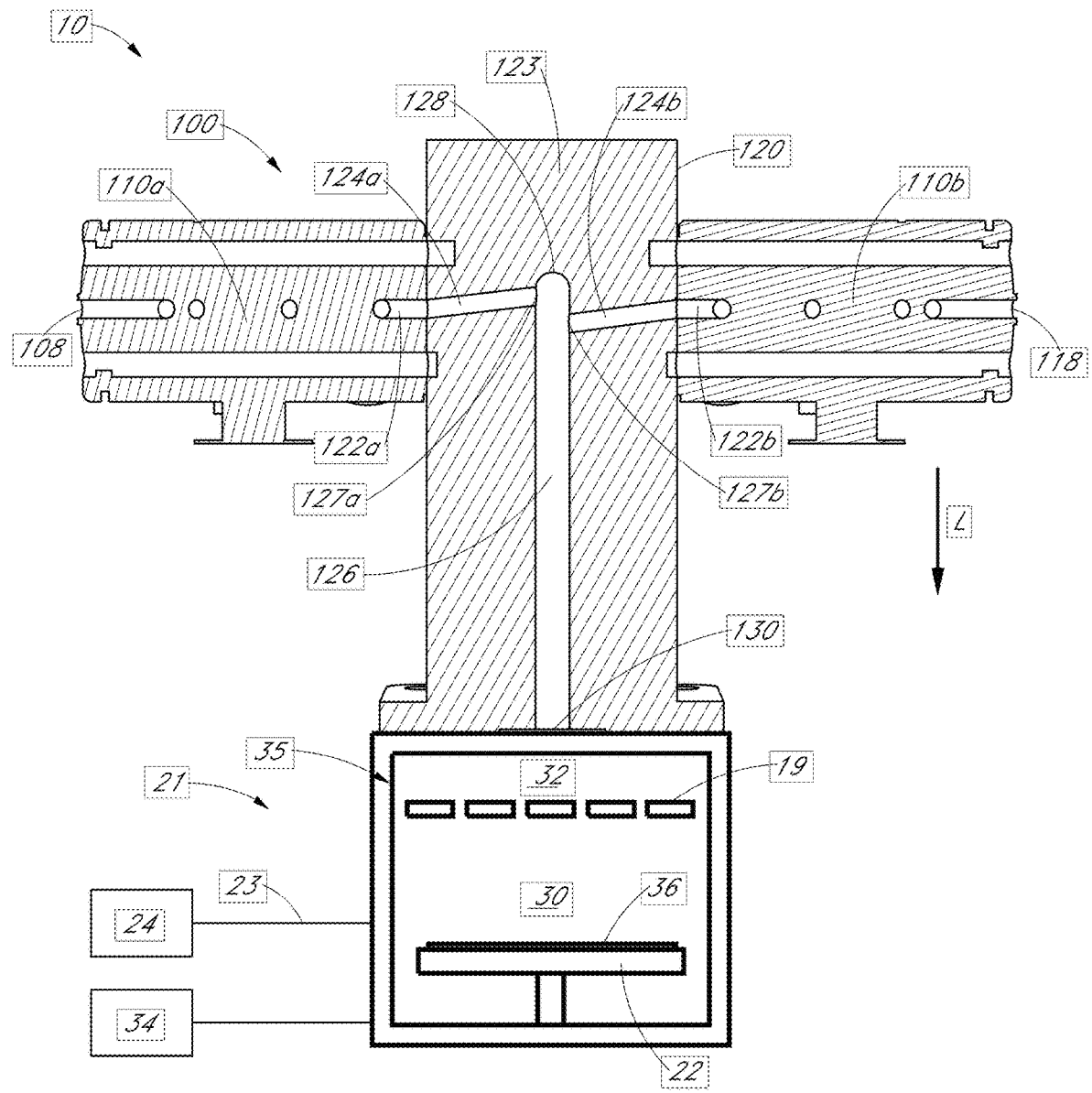
FIG. 4B is a cross-sectional view of a portion of the semiconductor processing device of FIG. 1.

FIG. 4A shows another schematic side sectional view of the semiconductor processing device 20 which shares all the components of FIG. 2 and therefore will not be discussed again. FIG. 4B is a schematic side sectional view of the semiconductor processing device 10 presented in FIG. 1. The device 10 of FIG. 4B can include a manifold 100 that defines a bore 126 through a manifold body 120. As with FIG. 4A, in some embodiments, the manifold 100 can be constructed by mounting multiple blocks to one another. However, advantageously, in the illustrated embodiment of FIG. 4B, the manifold 100 can be constructed of a single monolithic block which makes up the manifold body 120. A unitary block can improve the manifold body 120 by providing a leak-proof bore 126, for example, by obviating the use of o-rings and/or other interfaces. In various embodiments, deadlegs which can result in contamination may also be avoided. However, alternatively, the manifold body 120 can instead be made of an upper block, an intermediate block, and a lower block as shown in the embodiment of FIGS. 4A and 2. A skilled artisan will recognize multiple blocks and a unitary block are interchangeable based on cost and manufacturing tradeoffs. The use of multiple blocks can enable a modular construction of the module, including curved, angled, or other complex geometries. The bottom of the manifold body 120 can include an outlet 130. First and second valve blocks 110a, 110b can also be mounted to the manifold body 120.

The bore 126 of the manifold body 120 can deliver reactant and/or inactive gases to a reaction chamber 30 of a reactor 21 by way of the outlet 130 at the bottom of the manifold body 120. A dispersion device 35, such as a showerhead as shown, or a horizontal injection device in other embodiments, can include a plenum 32 in fluid communication with a plurality of openings 19. The reactant vapor can pass through the openings 19 and be supplied into the reaction chamber 30. A substrate support 22 can be configured, or sized and shaped, to support a substrate 36, such as a wafer, within the reaction chamber 30. The dispersed reactant vapor can contact the substrate and react to form a layer (e.g., a monolayer) on the substrate. The dispersion device 35 can disperse the reactant vapor in a manner so as to form a uniform layer on the substrate.

An exhaust line 23 can be in fluid communication with the reaction chamber 30. A vacuum pump 24 can apply suction to the exhaust line 23 to evacuate vapors and excess materials from the reaction chamber 30. The reactor 21 can comprise any suitable type of semiconductor reactor, such as an atomic layer deposition (ALD) device, a chemical vapor deposition (CVD) device, etc. Moreover, the device 10 can comprise a control system 34 in electronic and data communication with the reactor 21. The control system 34 can comprise one or a plurality of processors configured to control the operation of the device 10. Additional components may be provided to manage the operation of the device 10.

Supply channels 124a and 124b can be provided to supply gas from corresponding gas distribution channels to the bore 126. The first supply channel 124a and the second supply channel 124b can be in fluid connection with supply channels 122a and 122b located in the first valve block 110a and the second valve block 110b. The first and second supply channels 124a, 124b can merge with the bore 126 at approximately the same region along a longitudinal axis L of the manifold body 120, but inlet openings 127a, 127b into the bore 126 can be slightly offset along the longitudinal axis L. As shown in FIG. 4B, the bore 126 can extend continuously along the longitudinal axis L, such that the bore 126 does not include any turns or curved pathways, unlike the arrangement in FIGS. 2 and 4A. An upper end of the bore 126 can be capped by an upper wall 123 that defines a capping surface 128 at the upper end of the bore 126. The first supply channel 124a can be angled upward towards the capping surface 128 and the second supply channel 124b can be angled downward towards the outlet 130. Alternatively, the first supply channel 124a and second supply channel 124b can be fabricated to be at different levels and arrive at staggered positions at the bore 126. Therefore, the first supply channel 124a and second supply channel can be angled upwards, downwards, or straight across, and can merge with the bore 126 at offset positions along the longitudinal axis L. In FIG. 4B, the first and second valve blocks 110a, 110b can mechanically connect to the manifold body 120 without the use of o-rings. In some embodiments, for example, metal seals can be used between the manifold body 120 and the first and second valve blocks 110a, 110b.

The inlet opening 127a of the first supply channel 124a can direct gases upwardly into the capping surface 128, which may redirect the supplied gas(es) downwardly through the bore 130. Alternatively, the first supply channel 124a can terminate well below the capping surface 128. The capping surface 128 can comprise a curved surface shaped so as to efficiently direct the gases impinging on the surface 128 at an angle back down through the bore 126. In FIG. 4B, the capping surface 128 and the outlet 130 can be disposed along the linear longitudinal axis L of the bore 126. Thus, unlike FIG. 4A in which an inert gas inlet 220 is provided in the upper block 204, in the embodiment of FIG. 2B, the uppermost portion of the manifold body 120 is capped, such that the supplied gases, including reactant and inert gases, are provided from the side of the manifold 100.

Figure 7B:
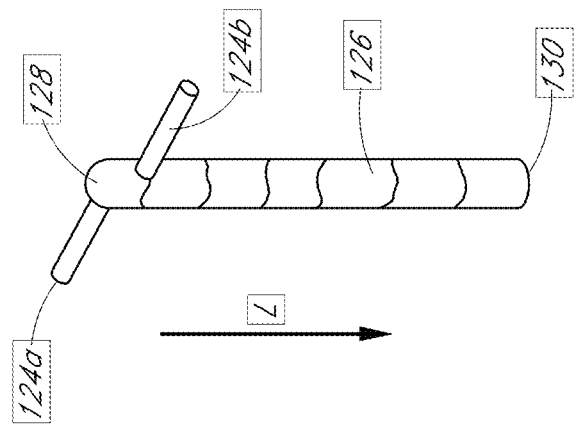
FIG. 7B is a perspective view of a bore and supply channels of the semiconductor processing device of FIGS. 4B, 5B, and 6B.
Figure 7A:
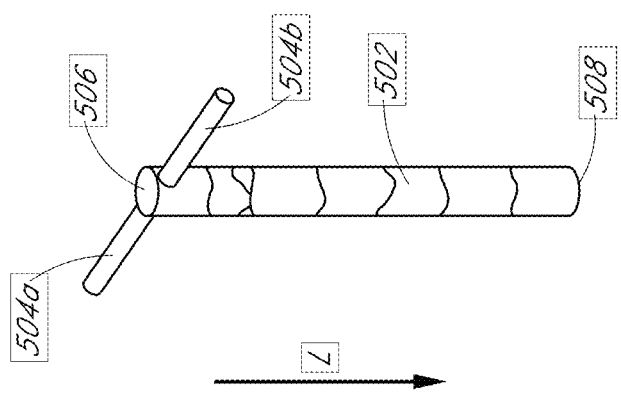
FIG. 7A is a perspective view of a bore and supply channels of a semiconductor processing device, according to various embodiments.

Beneficially, when the first supply channel 124a and the second supply channel 124b meet the bore 126 at a staggered offset position, there is reduced penetration of the first reactant into the second supply channel. An illustration of where the first supply channel 124a and second supply channel 124b meet the bore 126 at a staggered offset position is seen in FIG. 7B. In comparison, FIG. 7A illustrates an arrangement where the first supply channel 124a and the second supply channel 124b meet the bore 126 at the same position. FIGS. 7A and 7B are described in more detail below. Further, in some embodiments, a first reactant vapor (such as ammonia) can be supplied to the bore 126 along the first supply channel 124a. A second reactant vapor (such as titanium chloride) can be supplied to the bore 126 along the second supply channel 124b. As shown in FIG. 4B, the first and second supply channels 124a, 124b can be disposed opposite the bore 126 from one another.

Figure 10A:
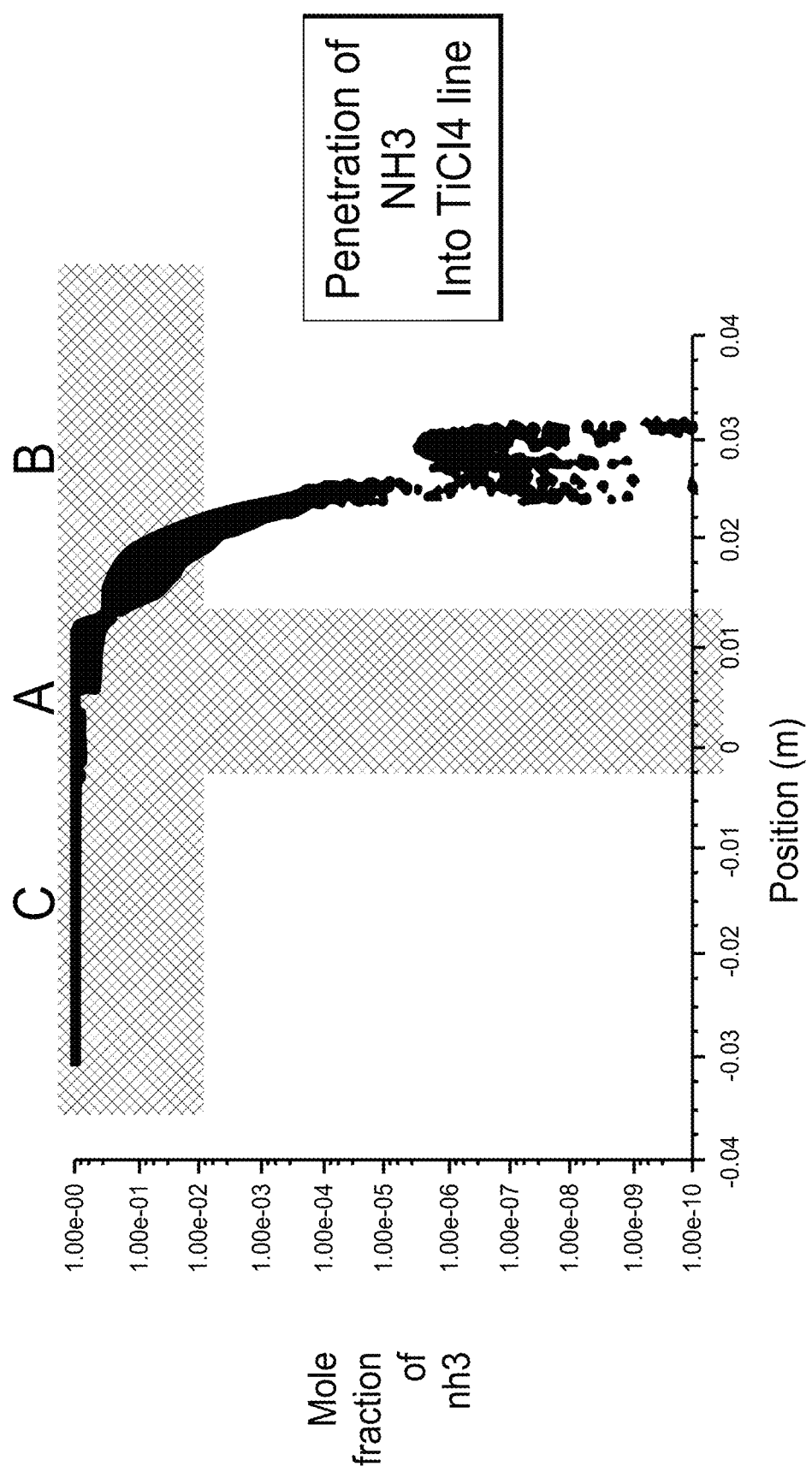
FIGS. 10A and 10B are plots of mole fraction of $NH_3$ reactant at positions within the supply channels and the bore respectively for the two different supply channel designs of FIGS. 7A and 7B.
Figure 10B:
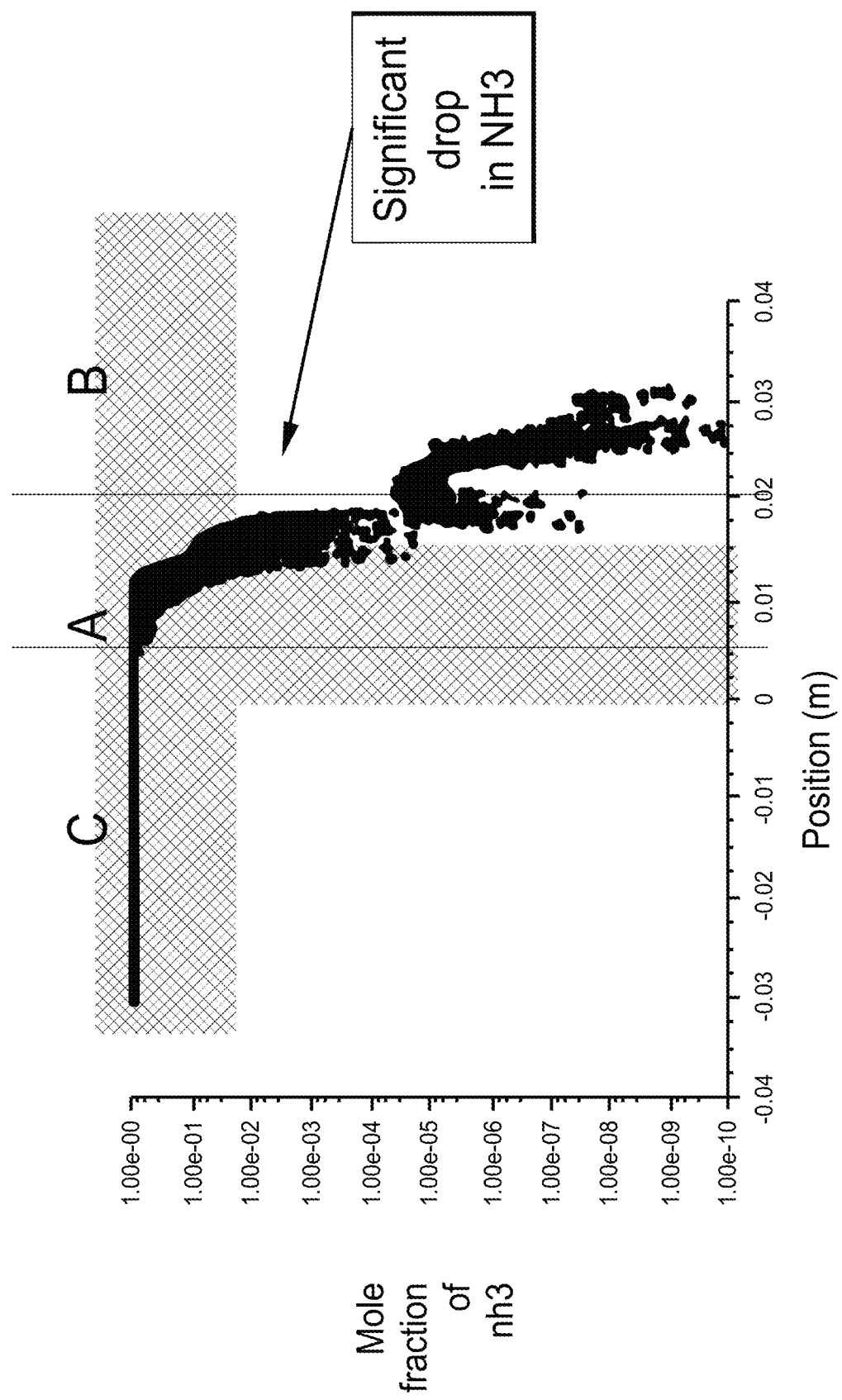

If the first and second supply channels 124a, 124b are disposed directly across from one another at the same location along the longitudinal axis L, then the first reactant vapor (e.g., ammonia) may be driven into the opposing second supply line 124b. An example of this effect is illustrated in FIG. 10A and is described in more detail below. Similarly, the second reactant vapor (e.g., titanium chloride) may be driven into the opposing first supply line 124a. In some arrangements, a low flow of inactive gas may be provided through the first and second supply lines 124a, 124b, which can serve as a barrier to reactant vapors from the opposing supply line. However, the reactant vapors may be directed at sufficiently high pressures so as to overcome the low pressure of the inactive gas. Accordingly, in the illustrated embodiment, the inlet openings 127a, 127b of the first and second supply channels 124a, 124b can be offset from one another along the longitudinal axis L. Moreover, in some embodiments, the inlet openings 127a, 127b can be angled opposite to one another along the longitudinal axis L. For example, as shown in FIG. 4B, the upstream first inlet opening 127a can be angled to have a directional component facing towards the capping surface 128 of the upper wall 123. The downstream second inlet opening 127b can be angled to have a directional component facing towards the outlet 130. Accordingly, the orientation and/or positioning of the first and second supply channels 124a, 124b can reduce or eliminate the penetration of the first reactant into the second supply channel 124b and the second reactant into the first supply channel 124a, which can reduce the effects of cross contamination and improve overall deposition quality. An example of this reduced cross contamination is illustrated in FIG. 10B and is described in more detail below.

Moreover, as compared with the arrangement of FIG. 4A, the bore 126 of FIG. 4B can provide improved flow conductance, e.g., higher flow rates, due to the use of a larger diameter bore 126. The larger diameter or major dimension can increase the flow rates of the gas flowing to the reactor 21.

Further, unlike the arrangement of FIG. 4A, purge or inactive gas inlets 108 and 118 can be located at the lateral sides opposite to the side where the valve blocks 110a/110b meet the manifold body 120. Thus, unlike the inlet 220 of FIG. 4A, in which inactive purge gas is directed downwardly through a funnel-shaped structure to the bore 230, in the embodiment of FIG. 4B, the inactive purge gas can be directed laterally through supply channels to the bore 126. In some embodiments, the inactive purge gas(es) can be directed through the first and second supply channels 124a, 124b through which the first and second reactant vapors are supplied to the bore 126. In other embodiments, the inactive purge gas(es) can be directed through additional supply channels that merge into the bore 126 from a side portion of the bore 126, rather than an upper portion of the bore 126. Beneficially, the embodiment of FIG. 4B can reduce or eliminate dead volumes above the merger point for reactant vapors and the resulting parasitic deposition that can occur in the device 20 of FIG. 4A. Further, the purge or inactive gas inlets 108 and 118 can be located at the last leg of the supply channel so that the whole channel can be directly accessed by the purge gases. Therefore, during the purge cycle, the entire supply channel can be purged which can reduce or eliminate dead volumes.

Figure 5A:
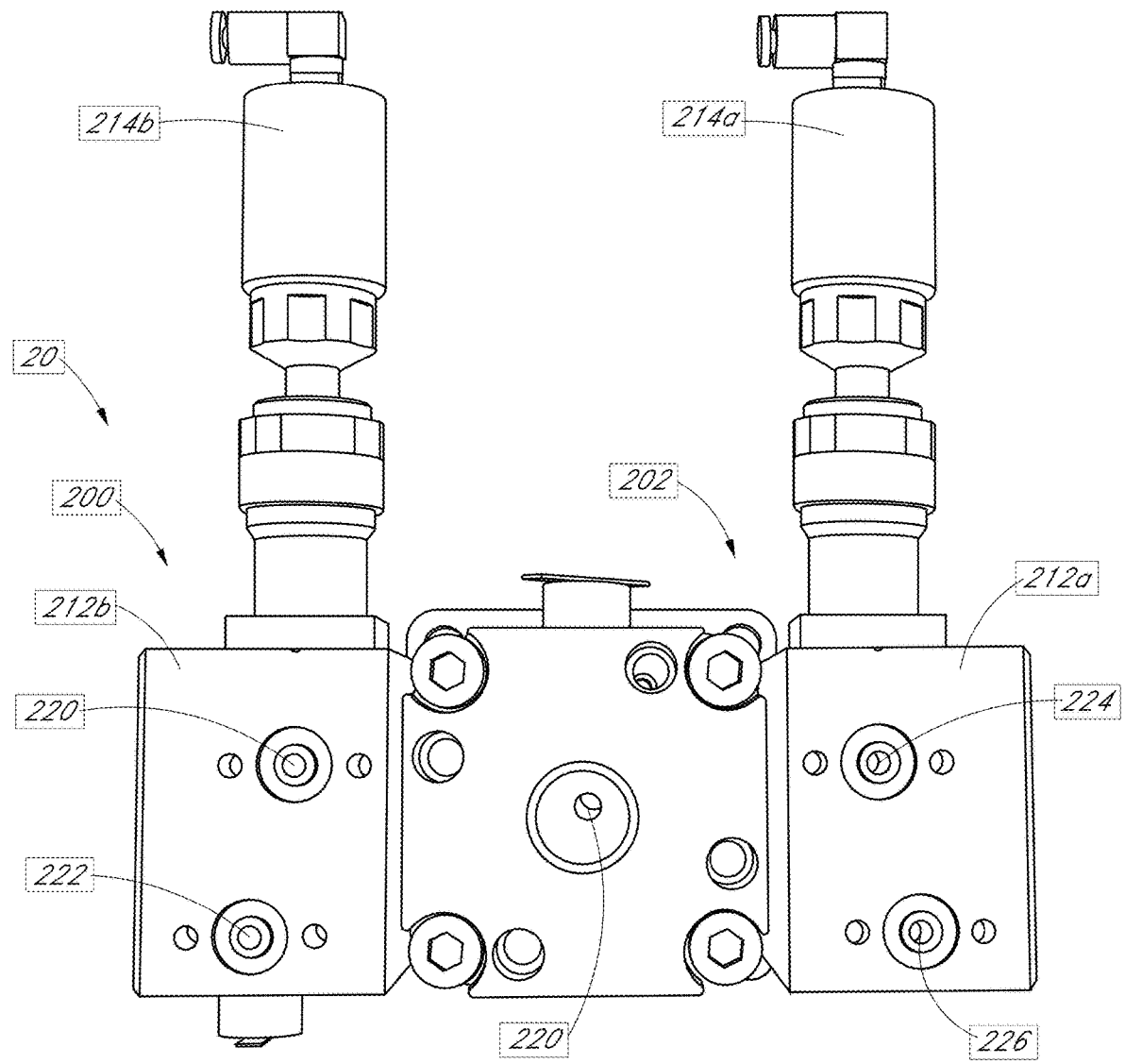
FIG. 5A is a top down view of the semiconductor processing device of FIG. 2.

FIG. 5A shows a top down view of the embodiment of FIGS. 2 and 4A. Each valve block 212b and 212a includes gas inlets. The first valve block 212b includes vapor phase inlet 220 used to input a first gas or vapor phase reactant. The first valve block 212b also includes vapor phase inlet 222 used to input a low flow rate inactive gas in order to carry vaporized reactant to the reactor 21 and/or to provide a buffer against cross-contamination from other reactants. The second valve block 212a includes vapor phase inlet 224 used to input a second gas or vapor phase reactant. The second valve block 212a also includes vapor phase inlet 222 used to supply inactive gas in order to carry vaporized reactant to the reactor 21 and/or to provide a buffer against cross-contamination from other reactants. The manifold body 202 includes the funnel-shaped inlet 220 in which high flow rate inactive gas enters the system in order to purge the device 20. As explained above in connection with FIGS. 2 and 4A, the funnel-shaped inlet 220 can direct the inactive purge gas downwardly into the bore 230. Also, additional etchants (for example, from an RPU) and coating agents (such as TMA) may enter the bore 230 from the funnel-shaped inlet 220. FIG. 5A also illustrates reactant valves 214a, 214b mounted to the respective valve blocks 212a, 212b. The reactant valves 214a, 214b can be used to regulate the flow of the first reactant vapor and the second reactant vapor, respectively.

Examples of inactive gas include argon (Ar) gas or nitrogen ($N_2$) gas, although any suitable inactive gas may be used. A mix of two different inactive gases can be used. Examples of a first gas phase reactant is a naturally gaseous ALD reactant such as $H_2$, $NH_3$, $N_2$, $O_2$, or O. The second gas or vapor phase reactant can be produced by a vaporizer (not shown) for vaporizing a reactant which is solid or liquid at room temperature and atmospheric pressure. The vaporizer(s) can comprise, e.g., liquid bubblers or solid sublimation vessels. Examples of solid or liquid reactants that can be held and vaporized in a vaporizer include, without limitation, liquid organometallic precursors such as trimethylaluminum (TMA), TEMAHf, or TEMAZr; liquid semiconductor precursors, such as dichlorosilane (DCS), trichlorosilane (TCS), trisilane, organic silanes, or $TiCl_4$; and powdered precursors, such as $ZrCl_4$ or $HfCl_4$. The skilled artisan will appreciate that embodiments can include any desired combination and arrangement of naturally gaseous, solid or liquid reactant sources. In one implementation, the first reactant vapor comprises $NH_3$ and the second reactant vapor comprises $TiCl_4$.

Figure 5B:
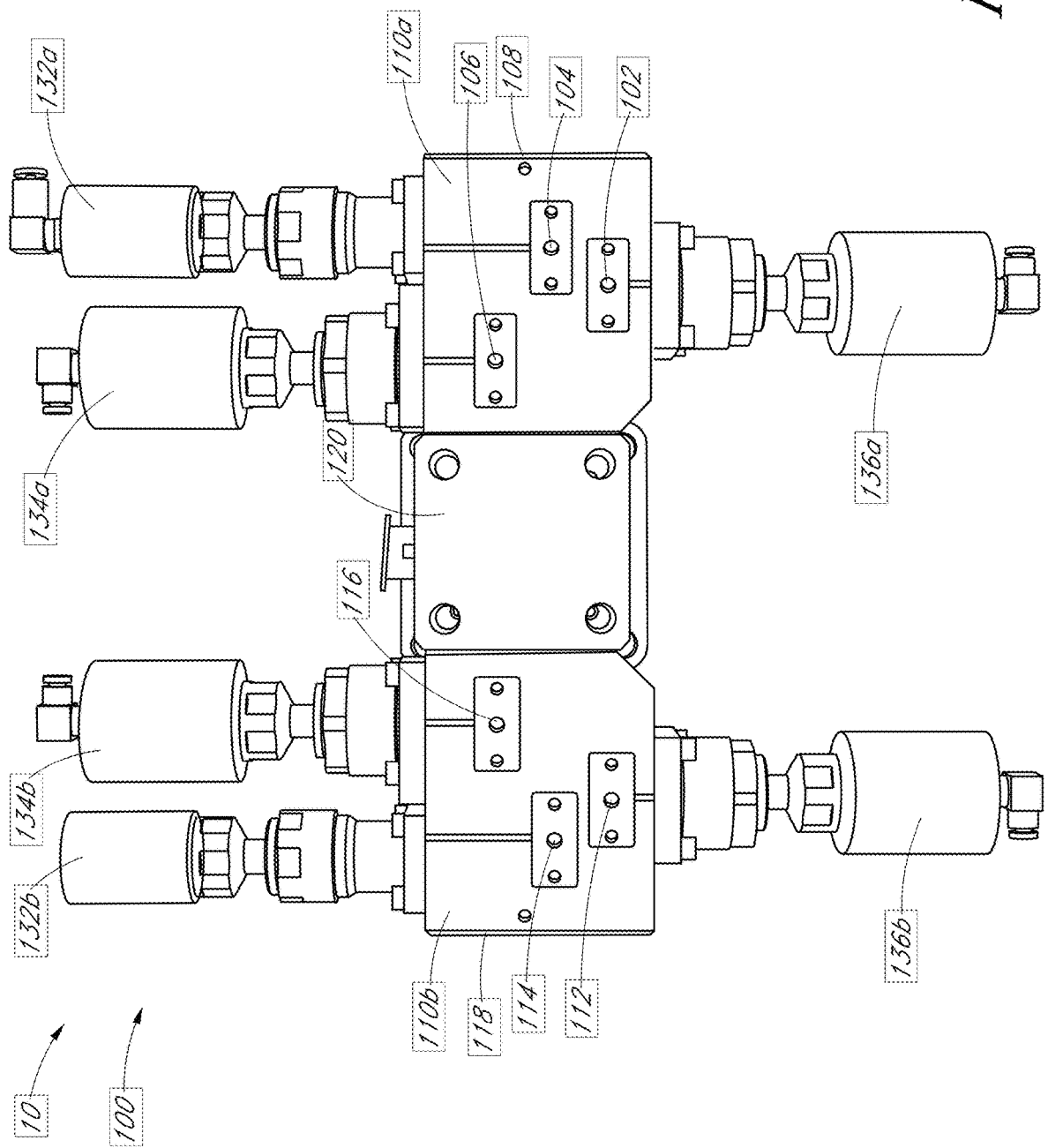
FIG. 5B is a top down view of the semiconductor processing device of FIGS. 1 and 4B.

FIG. 5B shows a top down view of the embodiment of FIGS. 1 and 4B. Similar to the first valve block 212b of FIG. 5A, the first valve block 110b includes a vapor phase inlet 116 used to supply a first gas or vapor phase reactant and a vapor phase inlet 114 used to supply inactive gas to serve as a carrier or buffer. The first valve block 110b includes additional vapor phase inlet 112 used to supply an etchant (such as RPU). It is noted that the inlet 112 is disposed on a lateral side of the manifold body 120, e.g., in the valve block 110b, instead of communicating with the funnel-shaped inlet 220 shown in FIG. 5A. Advantageously, locating the vapor phase inlet 112 at the lateral side of the manifold body leads to a decrease in dead volume which decreases the amount of parasitic deposition. Further, the first valve block 110b also includes additional inactive vapor phase inlet 118 in which high flow rate inactive gas enters the bore 126 in order to purge the manifold 120. The vapor phase inlet 118 can also be disposed on a lateral side of the manifold body 120, e.g., in the valve block 110b, instead of communicating with the funnel-shaped inlet 220 shown in FIG. 5A. For example, as shown in FIG. 5B, the inactive vapor phase inlet 118 can be placed on the side opposite to the side in which the first valve block 110b meets the manifold body 120.

Further, similar to the second valve block 212a of FIG. 5A, the second valve block 110a includes a vapor phase inlet 106 used to input a second gas or vapor phase reactant and a vapor phase inlet 104 used to supply low flow rate inactive gas to serve as a carrier or buffer. The second valve block 110a includes additional vapor phase inlet 102 used to input a coating material (e.g., TMA). It is noted that the inlet 102 can be disposed on a lateral side of the manifold body 120, e.g., in the valve block 110a, instead of communicating with the funnel-shaped inlet 220 shown in FIG. 5A. Further, the second valve block 110a also includes additional vapor phase inlet 108 in which high flow rate inactive gas enters the bore 126 in order to purge the manifold 120. The inactive vapor inlet 108 can also be disposed on a lateral side of the manifold body 120, e.g., in the valve block 110a, instead of communicating with the funnel-shaped inlet 220 shown in FIG. 5A. For example, as shown in FIG. 5B, the inactive vapor phase inlet 108 can be placed on the side opposite to the side where the second valve block 110a meets the manifold body 120. Similar to FIG. 5A, FIG. 5B illustrates also reactant valves 134a, 134b mounted to the respective valve blocks 110a, 110b. FIG. 5B further illustrates inactive gas valves 132a, 132b and additional first and second valves 136a, 136b mounted to the respective valve blocks 110a/110b. The inactive gas valves 132a, 132b control the inert gas entering from the additional vapor phase inlets 108, 118. Further, as explained above, the first and second valves 136a, 136b can control a coating material (e.g., TMA) entering from the vapor phase inlet 102 and an etchant (e.g., an etchant from an RPU) entering from the vapor phase inlet 112, respectively. The description of examples of inert gas, first reactant, and second described above in the description of FIG. 5A is also applicable in FIG. 5B and will not be repeated.

Figure 6A:
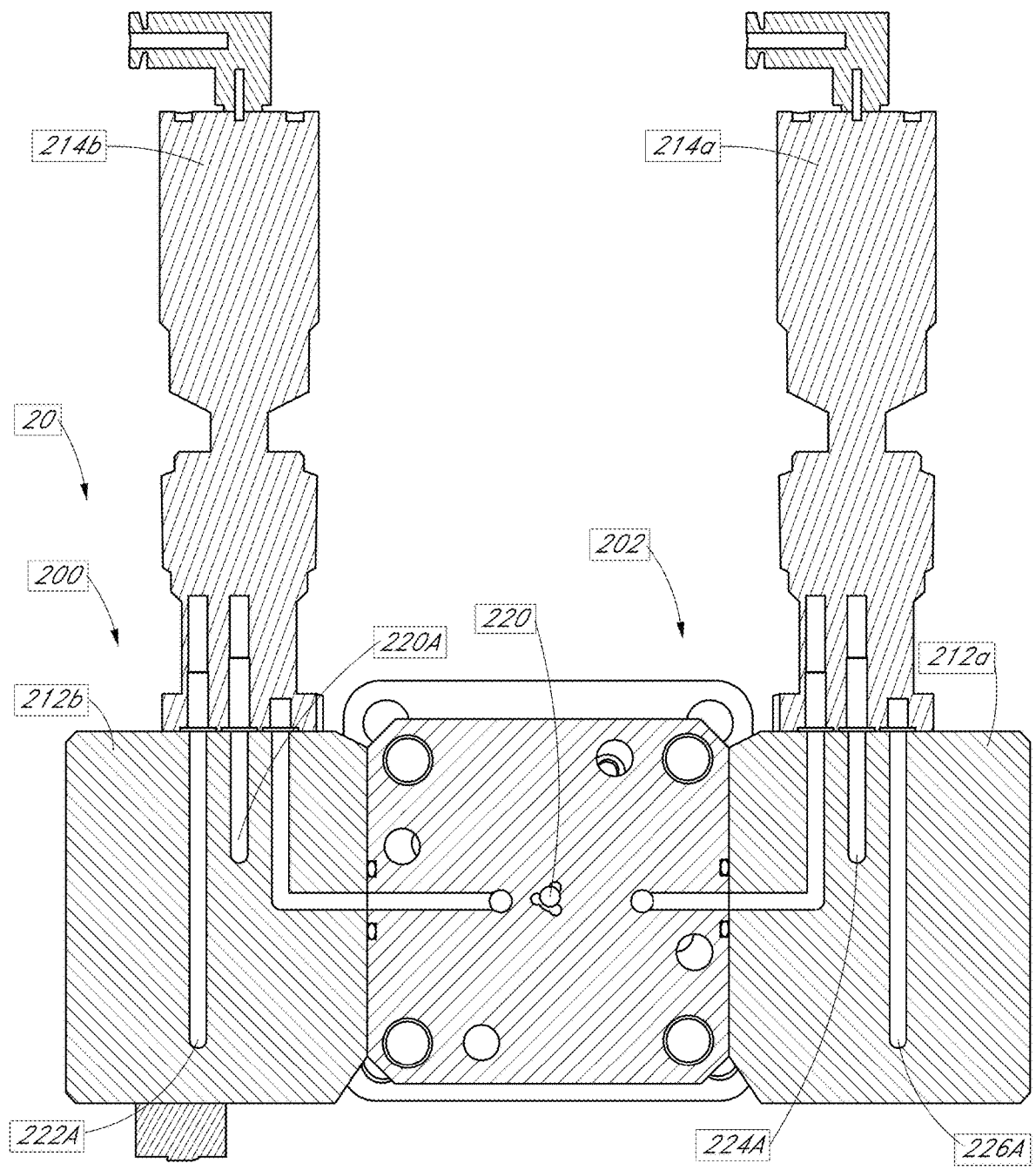
FIG. 6A is a top cross-sectional view of the semiconductor processing device of FIG. 4A.
Figure 6B:
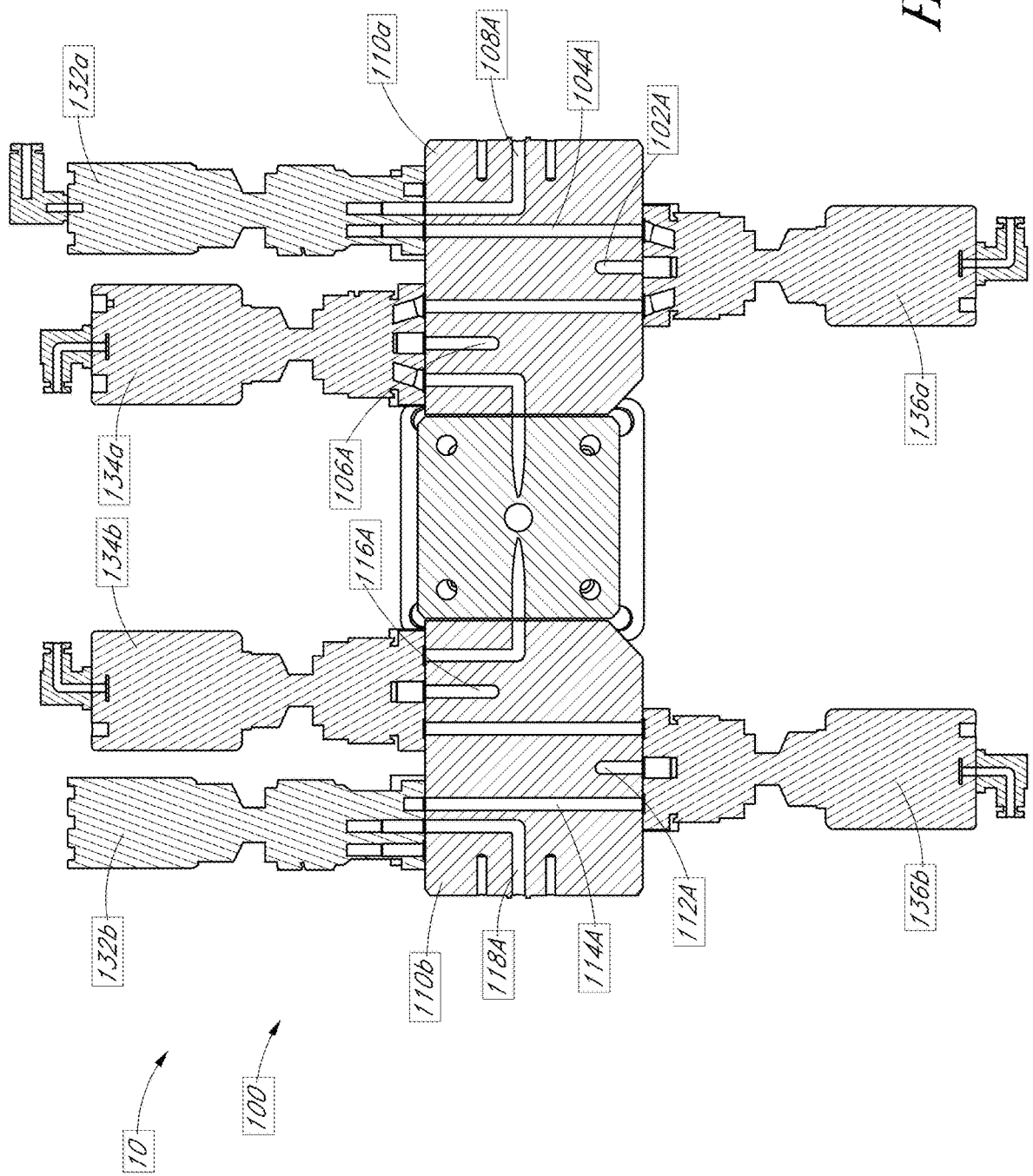
FIG. 6B is a top cross-sectional view of the semiconductor processing device of FIG. 4B.

FIGS. 6A and 6B are top cross sectional views of the arrangements of FIGS. 5A and 5B, respectively, showing internal channels within the manifolds. In FIG. 6A, internal channels 220A, 222A, 224A, 226A correspond to internal supply lines that convey the respective vapors from the vapor phase inlets 220, 222, 224, 226, with the reference numerals for the inlets appended by the letter "A" to refer to the corresponding internal supply channel. Similarly, in FIG. 6B, internal channels 102A, 104A, 106A, 108A, 112A, 114A, 116A, 118A correspond to internal supply lines that convey the respective vapors from the corresponding vapor phase inlets 102, 104, 106, 108, 112, 114, 116, 118, with the reference numerals for the inlets appended by the letter "A" to refer to the corresponding internal supply channel. In FIG. 6A, the internal channels are in fluid communication with the reactant valves 214a, 214b which regulate the flow of first reactant and second reactant into the reaction chamber. In FIG. 6B, the internal channels are also in fluid communication with the reactant valves 134a, 134b which regulate the flow of first reactant and second reactant. Additionally, FIG. 6B illustrates inactive gas valves 132a, 132b and the first and second valves 136a, 136b as described above. Beneficially, the inactive gases from the inactive gas valves 132a, 132b can flow through the entire channel which allows the entire channel to be purged of reactants and yields reduced dead volume.

FIGS. 7A and 7B are perspective views of the interior bores and supply channels for two different arrangements of the first and second supply lines to the bore. FIG. 7B is the offset design shown in FIG. 4B in which a capping surface 128 is disposed at an upper portion of the bore 126 and directs the vapors down the bore 126 through the outlet 130. FIG. 7A also shows a similar design in which a capping surface 506 directs vapors down a bore 502 through an outlet 508. In FIG. 7B, as with FIG. 4B, the supply channels 124a, 124b merge with the bore 126 at locations that are offset relative to the longitudinal axis L. In FIG. 7A, by contrast, the supply channels 504a, 504b meet at the same position with the bore 126 along the longitudinal axis L. As explained above, the arrangement of FIG. 7B can beneficially reduce cross-contamination of reactants in the supply channels 124a, 124b.

Figure 8A:
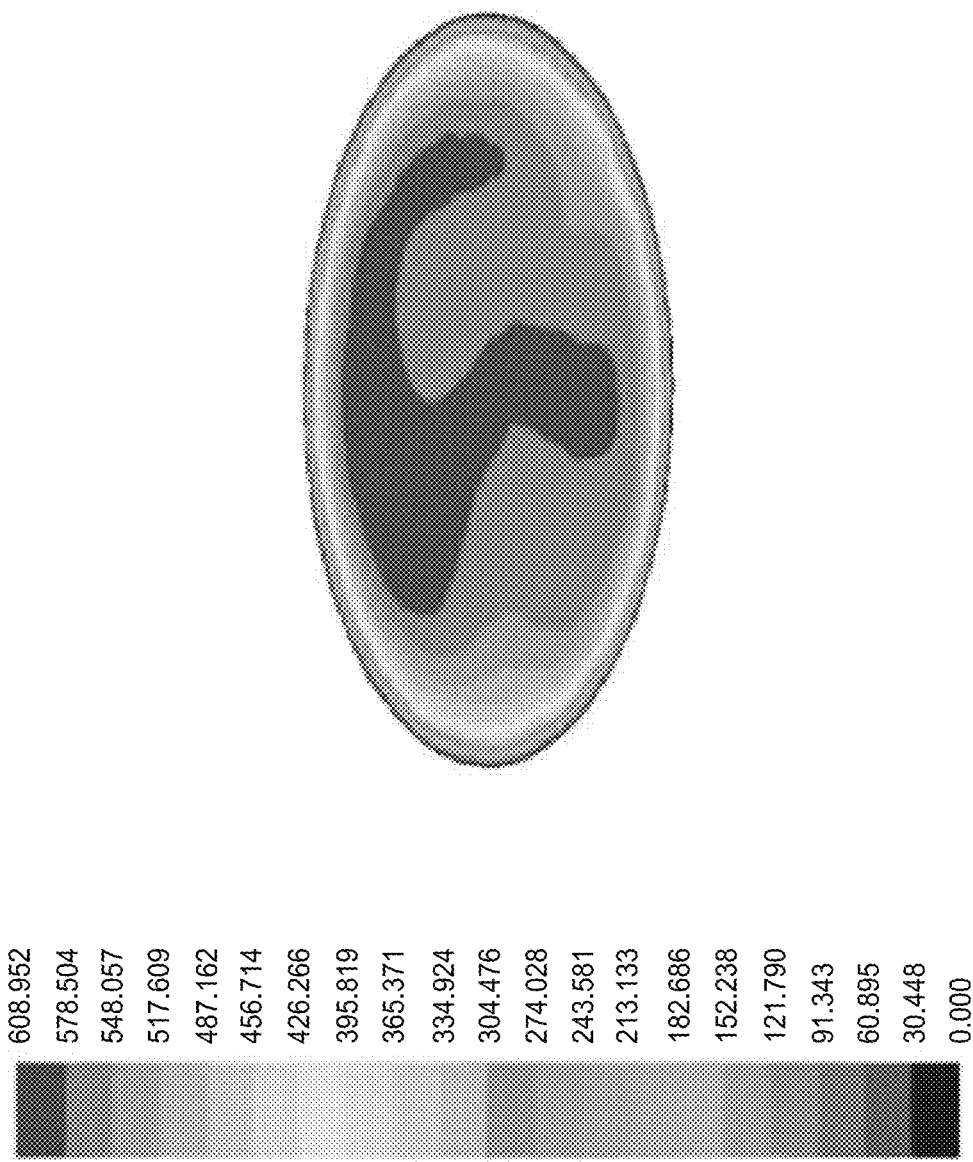
FIGS. 8A and 8B are velocity plots vapors passing through the respective bores for the two different supply channel designs of FIGS. 7A and 7B.
Figure 8B:
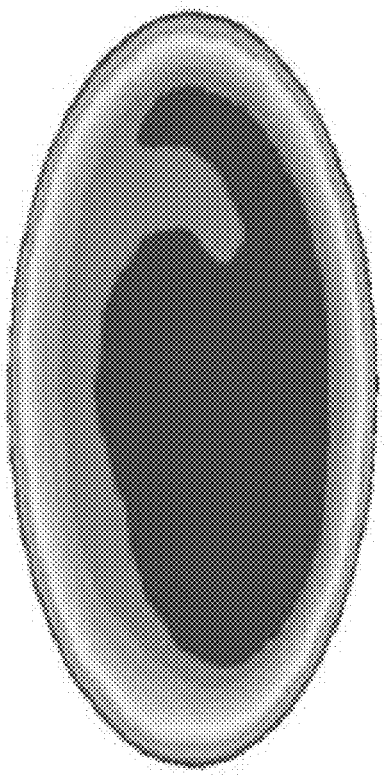
Figure 8B:
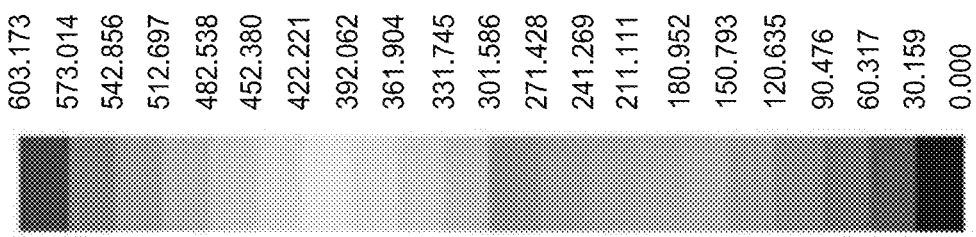
Figure 9A:
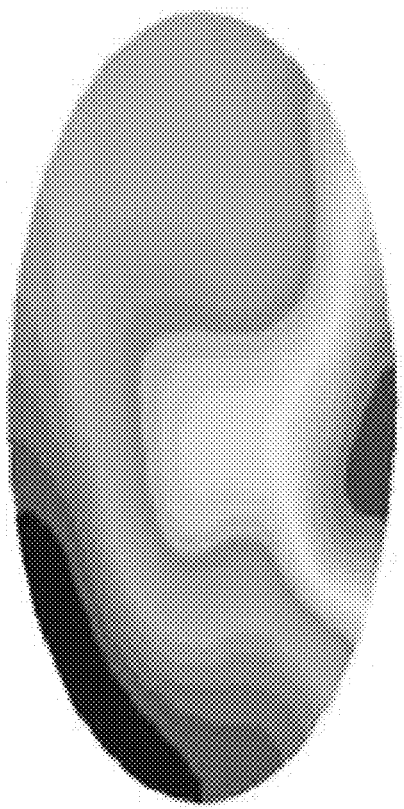
FIGS. 9A and 9B are mole fraction plots of ammonia ($NH_3$) reactant for the respective bores of the two different supply channel designs of FIGS. 7A and 7B.
Figure 9A:
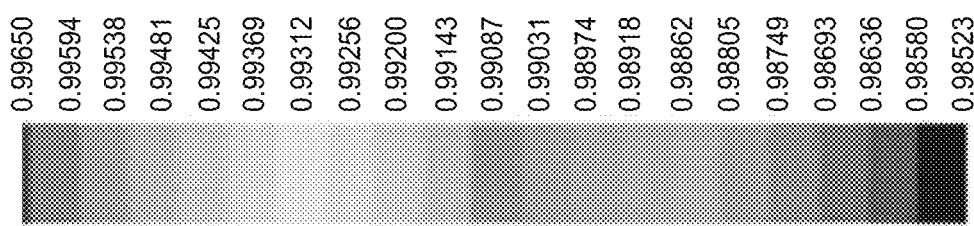
Figure 9B:
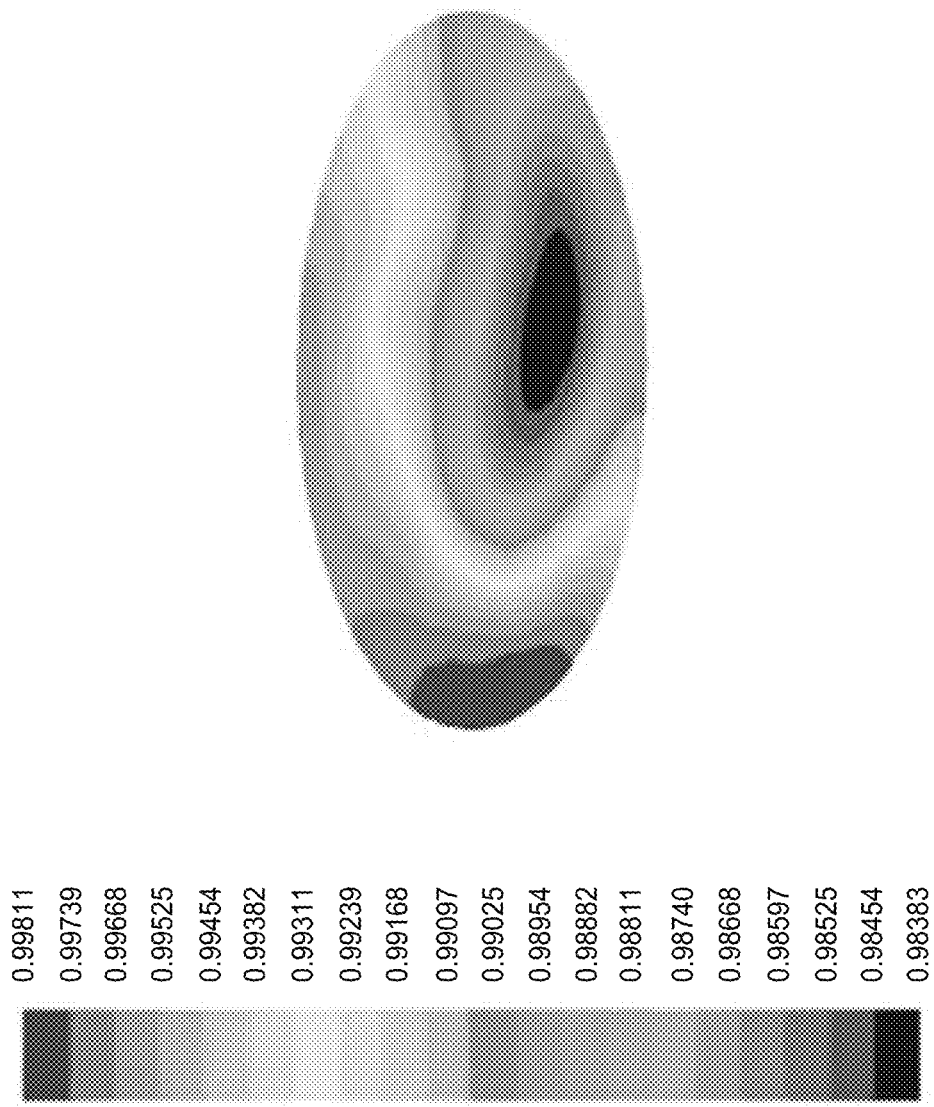

FIGS. 8A and 8B shows the velocity plots of the respective bores for the two different supply channel designs of FIGS. 7A and 7B. In FIG. 8B, little or no "throw" is observed, meaning that non-uniformities due to angular momentum of the vapors is reduced. FIGS. 9A and 9B illustrates a $NH_3$ reactant mole fraction plot of the respective bores for the two different supply channel designs of FIGS. 7A and 7B, respectively. The non-uniformity displayed in FIG. 9A is lower than the non-uniformity displayed in FIG. 9B. Further, note that non-uniformity of the bore in the design of FIGS. 2, 4A, 5A, and 6A is significantly lower than the non-uniformity displayed in FIGS. 9A and 9B. While non-uniformity during mixed deposition of two reactants may be higher in the design of FIGS. 7A and 7B (and 4B) as compared with that of FIG. 4A, in some embodiments it may be more important to provide high flow rate or conductance pulses, for example, to achieve high aspect ratio structures. In such processes, mixing non-uniformity may be less important than high flow conductance, and the design of FIG. 4B may be preferred.

FIGS. 10A and 10B illustrates the mole fraction of $NH_3$ reactant the position within the supply channels and the bore, respectively, for the two different supply channel designs of FIGS. 7A and 7B. Region C to the left of the vertical extending yellow highlighted region depicts a position within the first supply channel which inputs $NH_3$ reactant. The $NH_3$ level is high in both the different supply channel designs within Region C. Region A within the vertical extending yellow highlighted region depicts the bore region. Comparing the right edge portion of Region A for FIGS. 10A and 10B, the $NH_3$ level tapers off much faster in the offset design depicted in FIG. 7B than the straight T design of FIG. 7A. Region B to the right of the vertical extending yellow highlighted region depicts a region within the second supply line. The left edge portion of Region B displaying where the bore meets the second supply line shows high concentrations of $NH_3$ in FIG. 10A and comparatively low concentrations of $NH_3$ in the same region in FIG. 10B depicting remarkably less penetration of $NH_3$ into the second supply line for the offset design of FIG. 7B. Therefore, there is less unwanted penetration of $NH_3$ into the second supply line in the offset design of FIG. 7B.

Although the foregoing has been described in detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention. Moreover, not all of the features, aspects and advantages described herein above are necessarily required to practice the present invention.

What is claimed is:
1. A semiconductor processing device comprising:
a manifold comprising:
a bore configured to deliver vaporized reactant to a reactor, the bore comprising straight walls parallel to a longitudinal axis;

an upper wall disposed at an upper portion of the manifold, the upper wall defining a capping surface at a first end of the bore along the longitudinal axis;

an outlet at a lower portion of the manifold along the longitudinal axis, the outlet configured to deliver gas to the reactor;

a first supply channel configured to supply gas to the bore; and a second supply channel configured to supply gas to the bore, wherein the first supply channel merges with the bore at an angle greater than 90 degrees with respect to a length of the bore above the first supply channel and the second supply channel merges with the bore at an angle less than 90 degrees with respect to a length of the bore above the second supply channel, wherein an inlet opening of the first supply channel merges with the bore at a first position along the longitudinal axis, and wherein an inlet opening of the second supply channel merges with the bore at a second position along the longitudinal axis, the first position different from the second position.

2. The semiconductor processing device of claim 1, wherein the capping surface is shaped to redirect upwardly directed gas downwardly back through the bore to the outlet.

3. The semiconductor processing device of claim 1, further comprising a first block mounted to the manifold, the first block and the manifold cooperating to at least partially define the first supply channel.

4. The semiconductor processing device of claim 3, further comprising a second block mounted to the manifold, the second block and the manifold cooperating to at least partially define the second supply channel.

5. The semiconductor processing device of claim 1, wherein the first supply channel is in fluid communication with a first reactant source and is configured to deliver a first vaporized reactant to the bore, and wherein the second supply channel is in fluid communication with a second reactant source and is configured to deliver a second vaporized reactant to the bore.

6. The semiconductor processing device of claim 1, wherein the first supply channel is in fluid communication with an inactive gas to purge the bore.

7. The semiconductor processing device of claim 1, further comprising a showerhead device below the outlet, the showerhead device configured to disperse a flow of the gas from the outlet.

8. The semiconductor processing device of claim 7, further comprising a reaction chamber below the showerhead device and a substrate support configured to support a substrate in the reaction chamber.

9. The semiconductor processing device of claim 3, wherein the first block comprises a first vapor phase inlet configured to input a first reactant into the first supply channel.

10. The semiconductor processing device of claim 9, wherein the first block further comprises a second vapor phase inlet and a third vapor phase inlet.

11. The semiconductor processing device of claim 10, wherein the first block further comprises a fourth vapor phase inlet, wherein the fourth vapor phase inlet is located on a lateral side of the first block opposite to the manifold.

12. The semiconductor processing device of claim 11, wherein the fourth vapor phase inlet is configured to input a purge gas into the manifold.

13. The semiconductor processing device of claim 1, wherein the first supply channel is angled towards the capping surface and the second supply channel is angled towards the outlet, the second supply channel downstream of the first supply channel.

14. The semiconductor processing device of claim 1, wherein the manifold comprises a single monolithic block.

15. The semiconductor processing device of claim 1, wherein the bore extends continuously along the longitudinal axis.

16. A semiconductor processing device comprising:
a manifold comprising a bore configured to deliver gas to a reaction chamber, the bore comprising straight walls parallel to a longitudinal axis;
an upper wall disposed at an upper portion of the manifold, the upper wall defining a capping surface at a first end of the bore along the longitudinal axis;
a first supply line configured to supply an inactive purge gas to the bore at a first location along the longitudinal axis downstream of the capping surface, wherein the first supply line is coupled with the bore at an obtuse angle with respect to an upper length of the bore so as to direct the inactive purge gas toward the capping surface;
a second supply line configured to supply a gas to the bore at a second location along the longitudinal axis, the second location different from the first location, wherein the second supply line is coupled with the bore at an acute angle with respect to the upper length of the bore so as to direct the gas toward the outlet at a lower portion of the manifold along the longitudinal axis and
wherein an inlet opening of each of the first and second supply lines merges into the bore.

17. The semiconductor processing device of claim 16, wherein the first supply line is connected to an inactive gas source to purge the bore.

18. The semiconductor processing device of claim 16, wherein the inactive gas comprises at least one of argon gas and nitrogen gas.

* * * * *